(12) United States Patent
Kao et al.

(10) Patent No.: US 12,218,221 B2
(45) Date of Patent: Feb. 4, 2025

(54) SEMICONDUCTOR DEVICE AND METHOD

(71) Applicant: Taiwan Semiconductor Manufacturing Co., Ltd., Hsinchu (TW)

(72) Inventors: Wan-Yi Kao, Baoshan Township (TW); Fang-Yi Liao, New Taipei (TW); Shu Ling Liao, Taichung (TW); Yen-Chun Huang, New Taipei (TW); Che-Hao Chang, Hsinchu (TW); Yung-Cheng Lu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 388 days.

(21) Appl. No.: 17/744,061

(22) Filed: May 13, 2022

(65) Prior Publication Data

US 2023/0155006 A1    May 18, 2023

Related U.S. Application Data

(60) Provisional application No. 63/264,200, filed on Nov. 17, 2021.

(51) Int. Cl.
*H01L 21/44* (2006.01)
*H01L 21/762* (2006.01)
(Continued)

(52) U.S. Cl.
CPC .. *H01L 29/66795* (2013.01); *H01L 21/76224* (2013.01); *H01L 21/823431* (2013.01);
(Continued)

(58) Field of Classification Search
CPC . H01L 21/02565; H01L 21/02; H01L 21/477; H01L 21/38; H01L 21/449; H01L 21/461; H01L 21/475; H01L 21/02365; H01L 21/0243; H01L 21/02472; H01L 21/02483; H01L 21/02502;
(Continued)

(56) References Cited

U.S. PATENT DOCUMENTS 11,437,269 B2 * 9/2022 Yang .................... C23C 16/045
2015/0200127 A1 7/2015 Chuang et al.
(Continued)

*Primary Examiner* — Nikolay K Yushin
(74) *Attorney, Agent, or Firm* — Slater Matsil, LLP

(57) ABSTRACT

Semiconductor devices including fin-shaped isolation structures and methods of forming the same are disclosed. In an embodiment, a semiconductor device includes a fin extending from a semiconductor substrate; a shallow trench isolation (STI) region over the semiconductor substrate adjacent the fin; and a dielectric fin structure over the STI region, the dielectric fin structure extending in a direction parallel to the fin, the dielectric fin structure including a first liner layer in contact with the STI region; and a first fill material over the first liner layer, the first fill material including a seam disposed in a lower portion of the first fill material and separated from a top surface of the first fill material, a first carbon concentration in the lower portion of the first fill material being greater than a second carbon concentration in an upper portion of the first fill material.

20 Claims, 48 Drawing Sheets

(51) Int. Cl.
*H01L 21/8234* (2006.01)
*H01L 27/088* (2006.01)
*H01L 29/06* (2006.01)
*H01L 29/66* (2006.01)
*H01L 29/78* (2006.01)

(52) U.S. Cl.
CPC ...... *H01L 27/0886* (2013.01); *H01L 29/0649* (2013.01); *H01L 29/7851* (2013.01)

(58) Field of Classification Search
CPC ......... H01L 21/02554; H01L 21/02587; H01L 21/02631; H01L 29/7869; H01L 29/786; H01L 29/24; H01L 29/16; H01L 29/18; H01L 29/20; H01L 29/22; H01L 29/517; H01L 29/66969; H01L 29/66; H01L 29/78642; H01L 29/78696; H01L 29/78612; H01L 29/78621; H01L 29/1033; H01L 29/42376; H01L 29/7838; H01L 29/10; H01L 29/1054; H01L 29/41733; H01L 29/417; H01L 29/4908; H01L 29/49; H10K 99/00; H10B 61/22; H10B 61/00; H10B 63/30
See application file for complete search history.

(56) References Cited

U.S. PATENT DOCUMENTS

2019/0326168 A1\* 10/2019 Yang ................. H01L 21/76879
2021/0249411 A1    8/2021 Liao et al.

\* cited by examiner

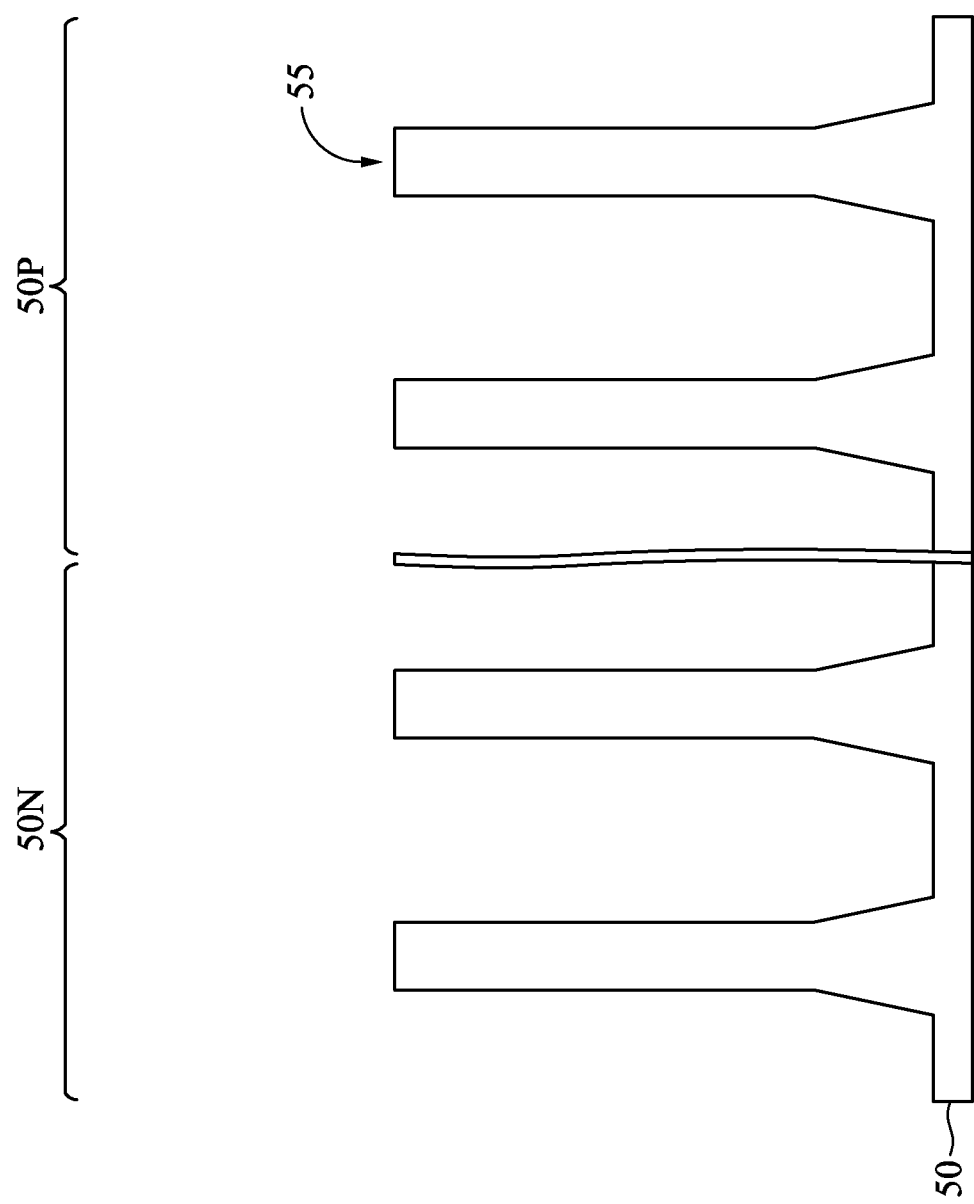

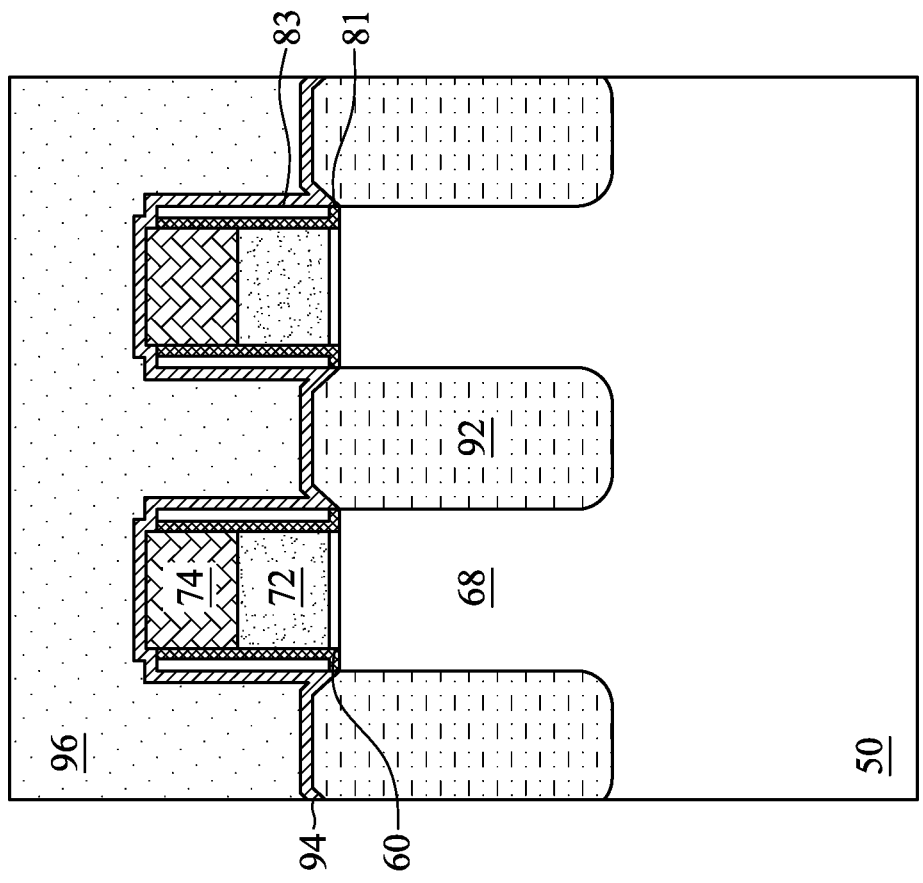
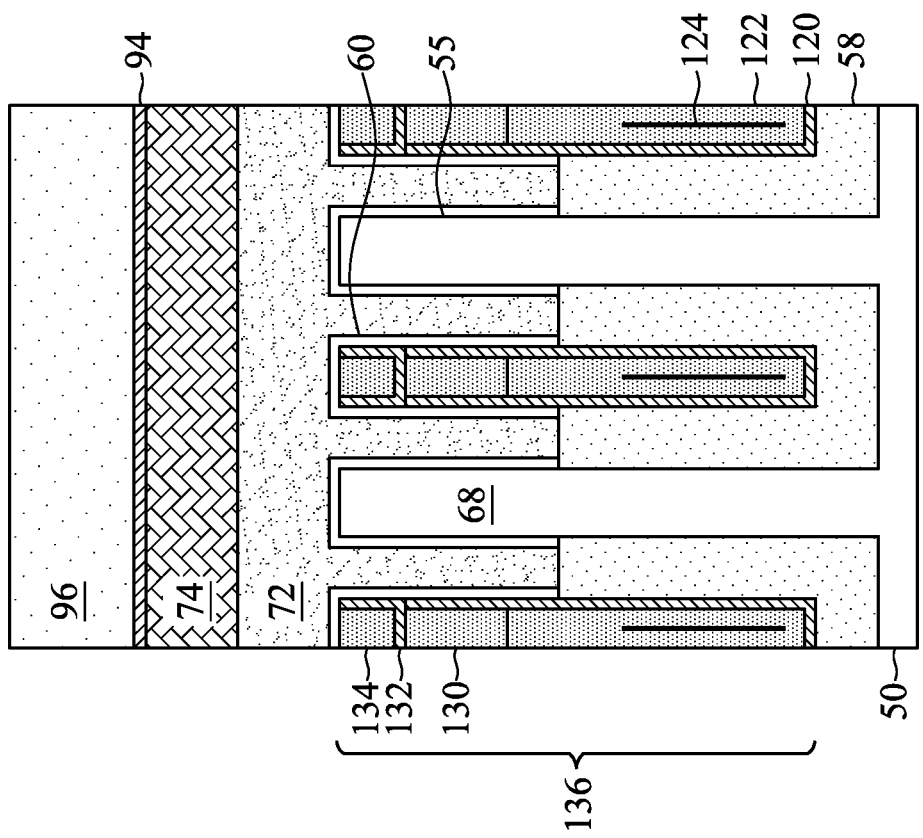
Figure 18A
Figure 18B

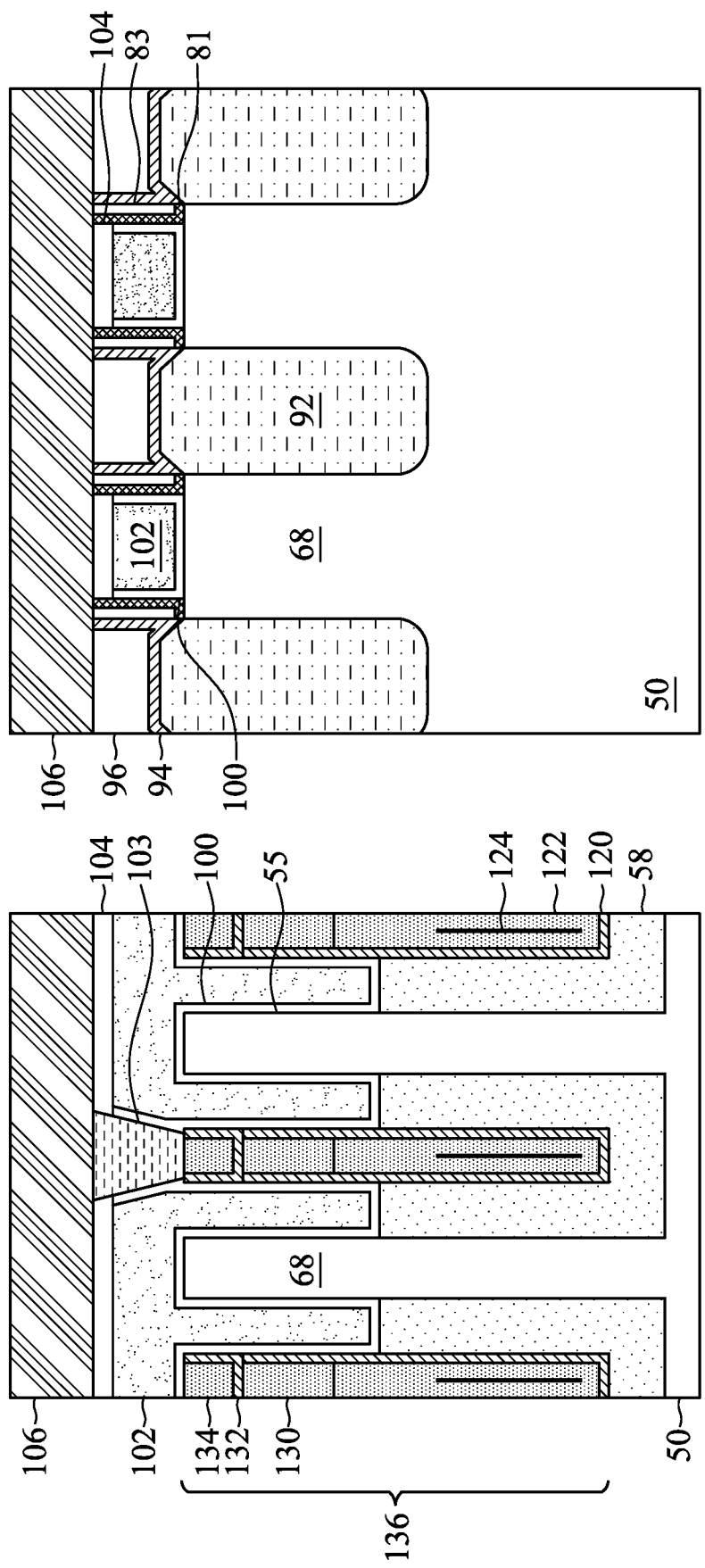

SEMICONDUCTOR DEVICE AND METHOD

PRIORITY CLAIM AND CROSS-REFERENCE

This application claims the benefit of U.S. Provisional Application No. 63/264,200, filed on Nov. 17, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A, 5B, 6A, 6B, 7A, 7B, 8A, 8B, 9A, 9B, 10A, 10B, 11, 12, 13A, 13B, 14A, 14B, 14C, 15A, 15B, 15C, 16A, 16B, 16C, 17A, 17B, 17C, 17D, 17E, 18A, 18B, 19A, 19B, 20A, 20B, 21A, 21B, 22A, 22B, 22C, 23A, 23B, 24A, 24B, 24C, 25, 26, 27, 28, 29A, 29B, 29C, 30A, 30B, and 30C are cross-sectional views and top-down views of intermediate stages in the manufacturing of semiconductor devices, in accordance with some embodiments.

DETAILED DESCRIPTION

Figure 1:
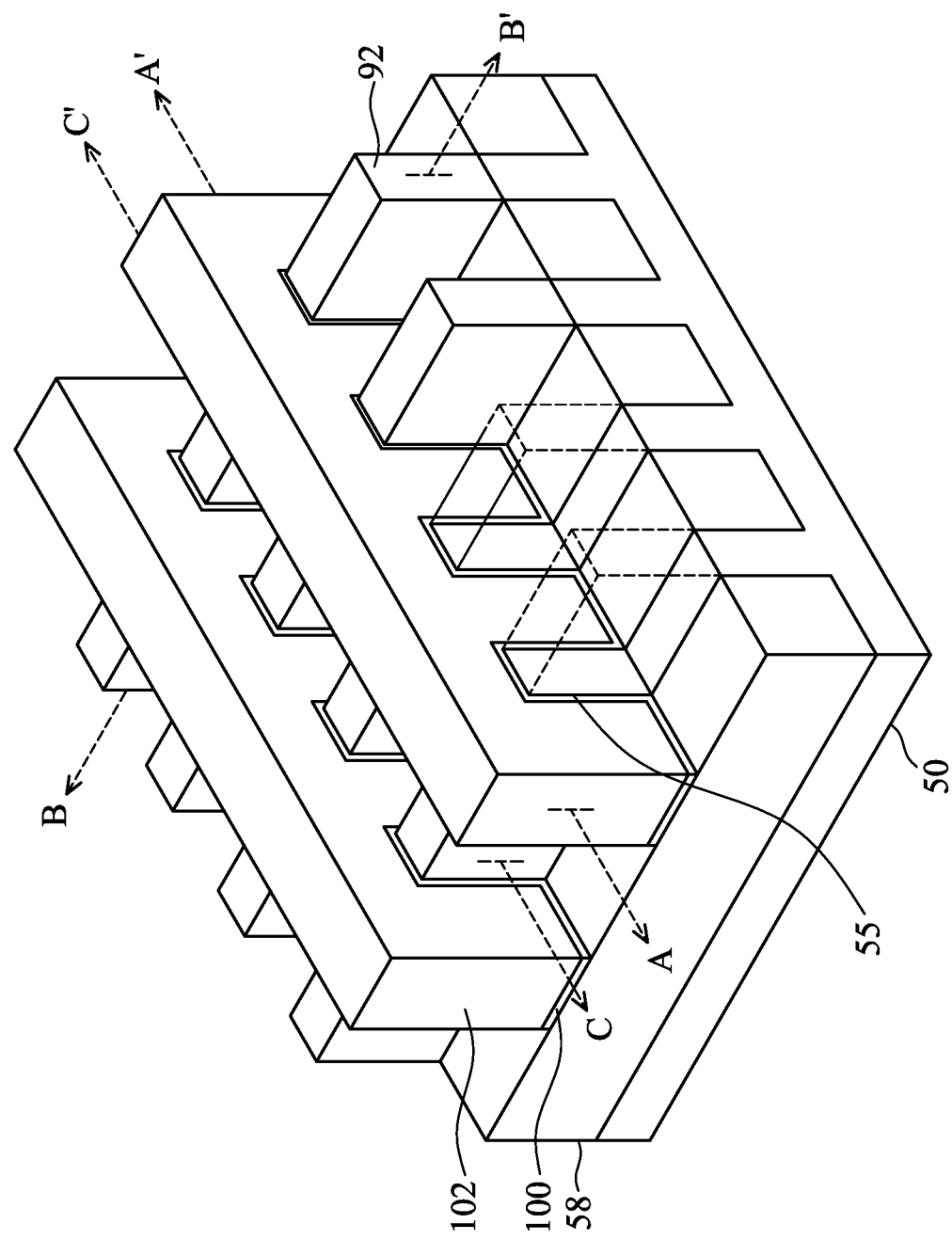
FIG. 1 illustrates an example of a semiconductor device including fin field-effect transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide an improved method for forming isolation structures in semiconductor devices and semiconductor devices formed by said methods. The method includes depositing a dielectric fin structure between semiconductor fin structures, etching back the dielectric fin structure, and performing an implantation process on the dielectric fin structure. The implantation process breaks bonds within in the dielectric fin structure and causes re-bonding within the dielectric fin structure, eliminating a seam in the portion of the dielectric fin structure exposed to the implantation process. Dopants such as nitrogen, argon, combinations thereof, or the like may be implanted into the dielectric fin structure during the implantation process. Additional deposition, etching back, and implantation processes may be repeated to form a final dielectric fin structure. Forming the dielectric fin structure according to this method results in a seam-free or substantially seam-free dielectric fin structure, which has greater etch resistance. This reduces device defects by preventing bridging between epitaxial structures, reducing cut gate failures, and the like.

FIG. 1 illustrates an example of FinFETs in a three-dimensional view, in accordance with some embodiments. The FinFETs comprise fins 55 on a substrate 50 (e.g., a semiconductor substrate). Isolation regions 58 are disposed in the substrate 50, and the fins 55 protrude above and from between neighboring isolation regions 58. Although the isolation regions 58 are described/illustrated as being separate from the substrate 50, as used herein the term "substrate" may be used to refer to just the semiconductor substrate or a semiconductor substrate inclusive of isolation regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring isolation regions 58.

Gate dielectric layers 100 are along sidewalls and over top surfaces of the fins 55, and gate electrodes 102 are over the gate dielectric layers 100. Epitaxial source/drain regions 92 are disposed on opposite sides of the fins 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the FinFETs. Cross-section B-B' is perpendicular to cross-section A-A' and is along a longitudinal axis of a fin 55 and in a direction of, for example, the current flow between the epitaxial source/drain regions 92 of the FinFETs. Cross-section C-C' is parallel to cross-section A-A' and extends through the epitaxial source/drain regions 92 of the FinFETs. Subsequent figures refer to these reference cross-sections for clarity.

Some embodiments discussed herein are discussed in the context of FinFETs formed using a gate-last process. In some embodiments, a gate-first process may be used. Some embodiments contemplate aspects used in planar devices, such as planar FETs, nanostructure (e.g., nanosheet, nanowire, gate-all-around, or the like) field effect transistors (NS-FETs), or the like.

FIGS. 2 through 30C are cross-sectional views of intermediate stages in the manufacturing of FinFETs, in accordance with some embodiments. FIGS. 2 through 12, 13A, 14A, 15A, 16A, 17A, 18A, 19A, 20A, 21A, 22A, 23A, 24A, 25 through 28, 29A, and 30A are illustrated along reference cross-section A-A' illustrated in FIG. 1. FIGS. 13B, 14B, 15B, 16B, 17B, 18B, 19B, 20B, 21B, 22B, 23B, 24B, 29B, and 30B are illustrated along reference cross-section B-B' illustrated in FIG. 1. FIGS. 14C, 15C, 16C, 17C, 17D, 17E, 24C, 29C, and 30C are illustrated along reference cross-section C-C' illustrated in FIG. 1. FIG. 22C illustrates a top-down view.

Figure 2:
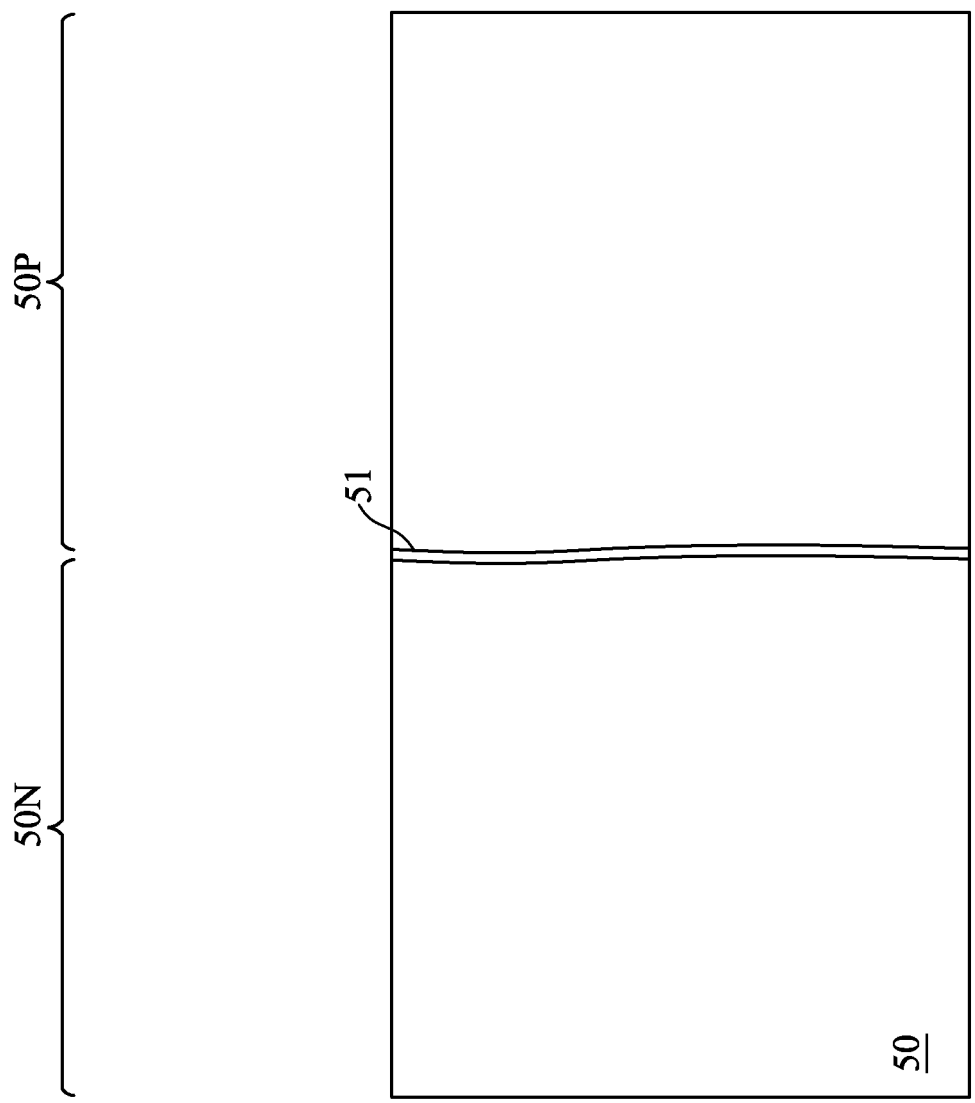

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 includes an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, or the like) may be disposed between the n-type region 50N and the p-type region 50P.

Figure 3A:
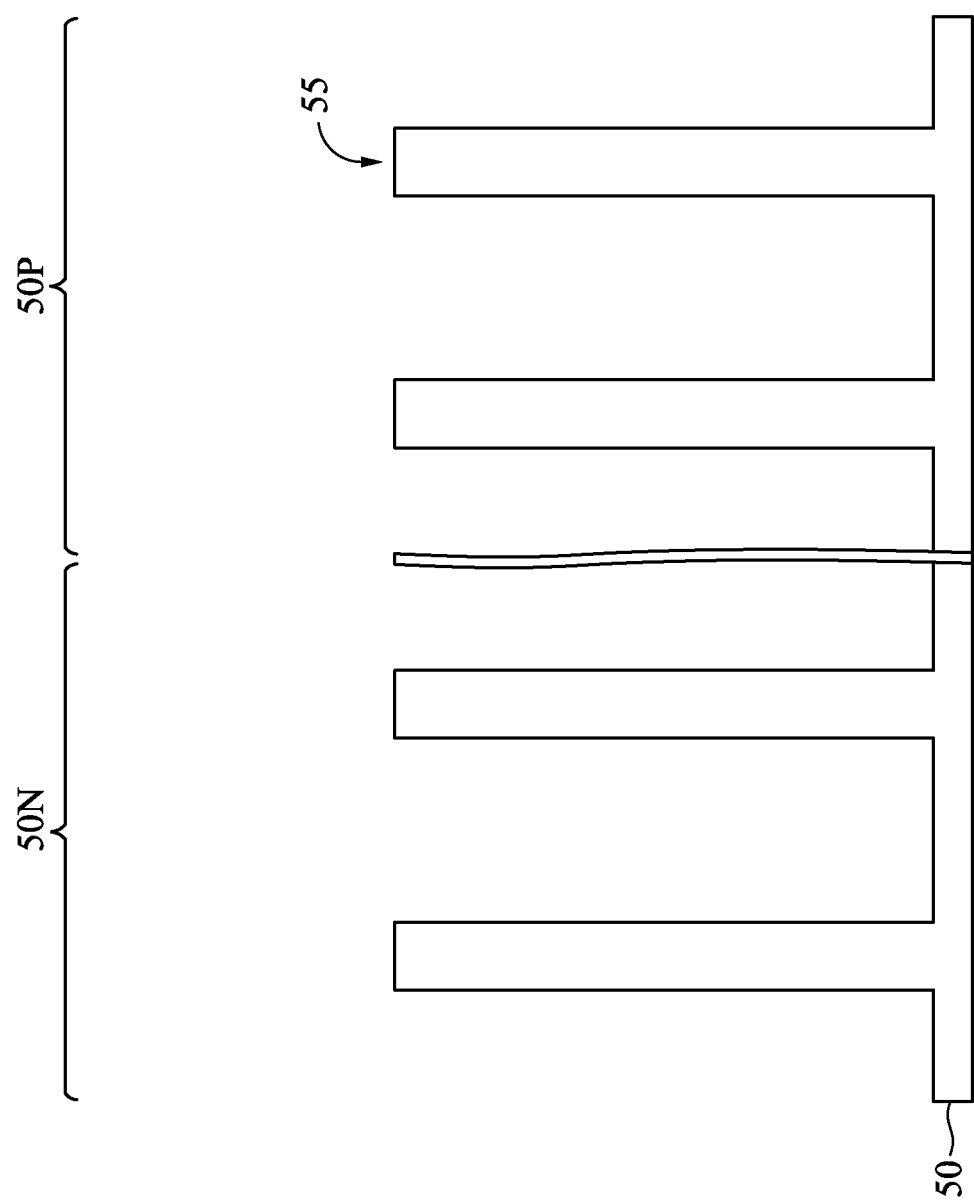

In FIGS. 3A and 3B, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), a neutral beam etch (NBE), the like, or a combination thereof. The etching may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 55. In some embodiments, the mask (or other layer) may remain on the fins 55. As illustrated in FIG. 3A, the fins 55 may have substantially straight, vertical sidewalls. As illustrated in FIG. 3B, in some embodiments, at least portions of the fins 55 may have tapered sidewalls, which taper in a direction away from the substrate 50.

Figure 4A:
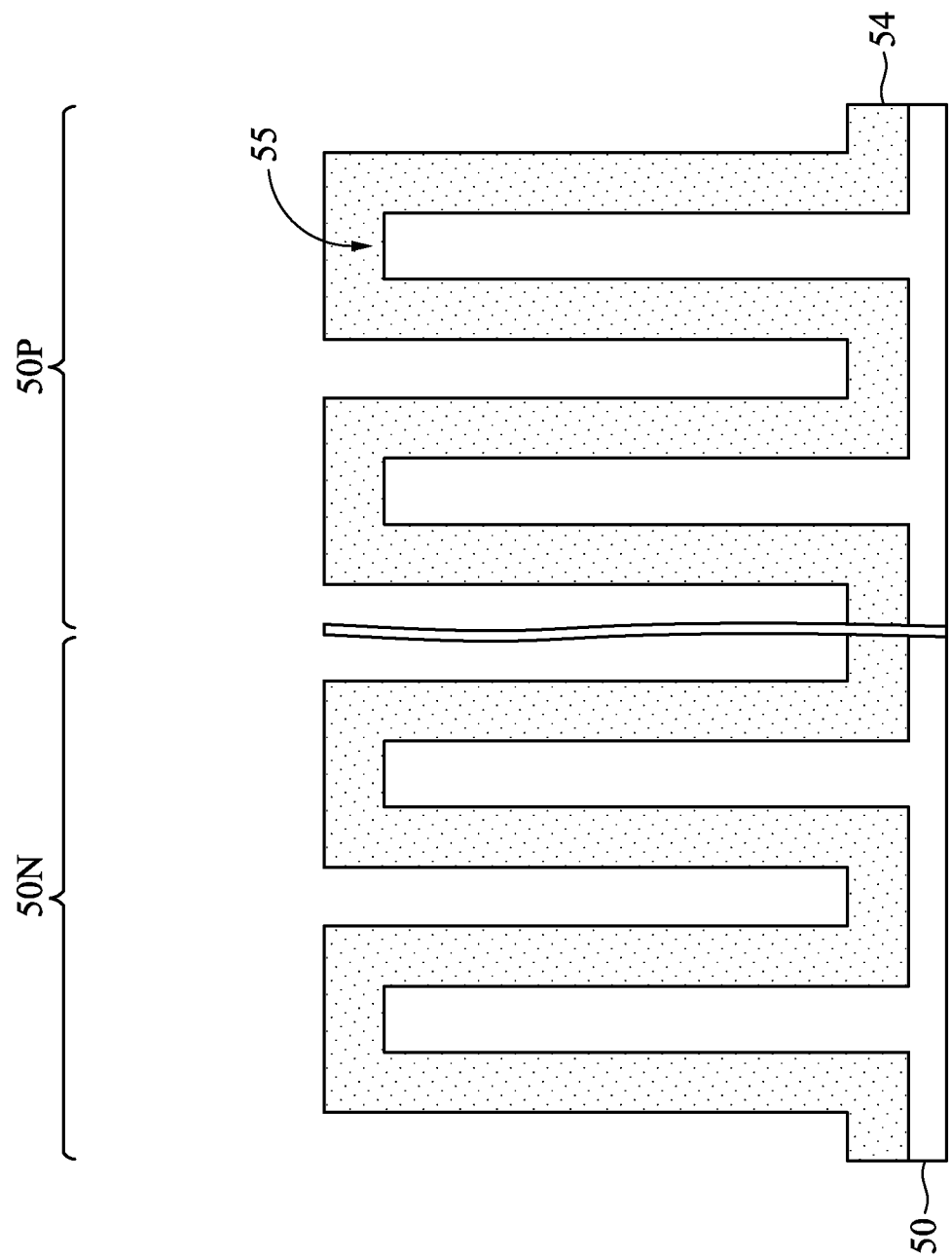
Figure 4B:
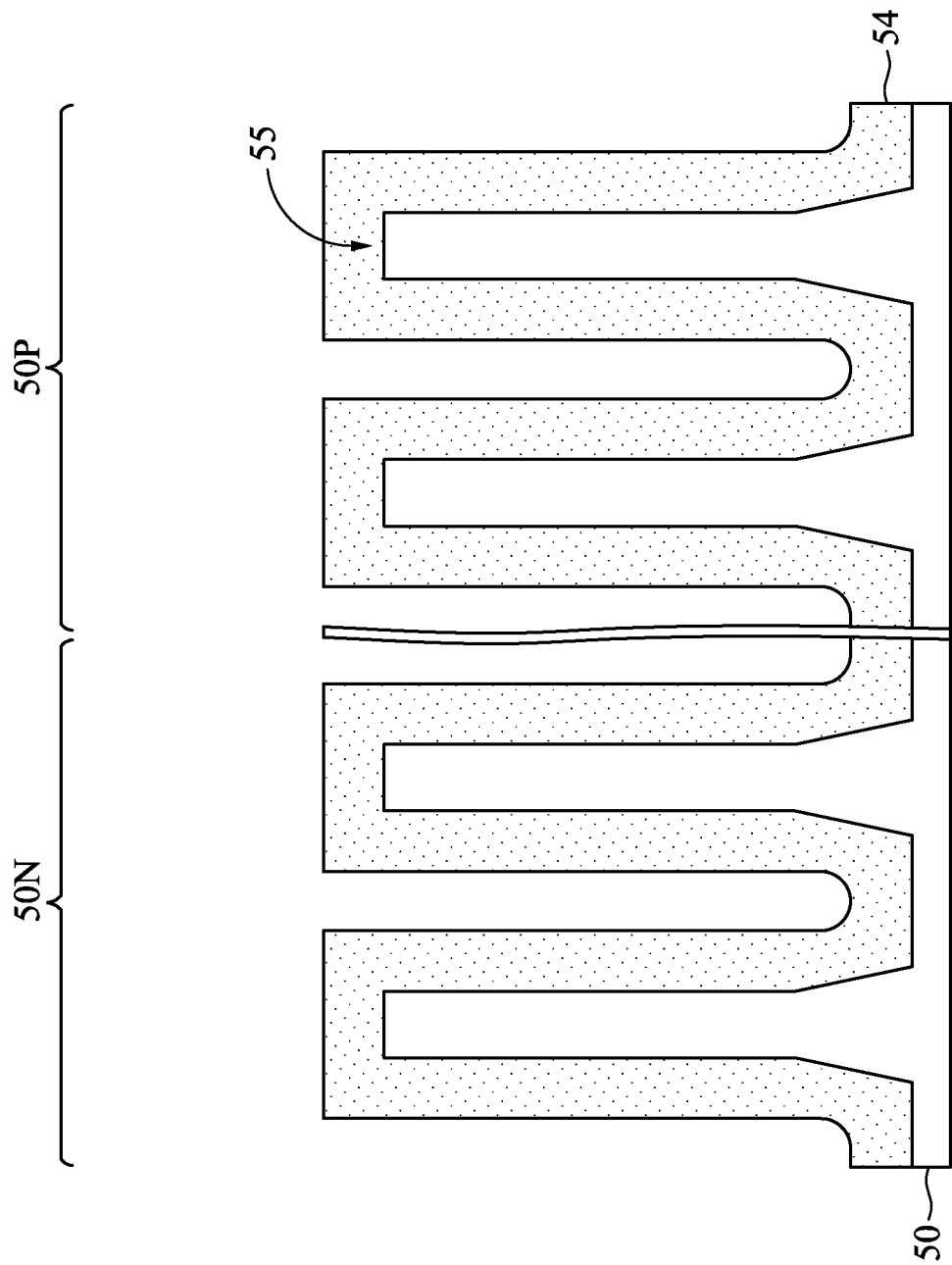

In FIGS. 4A and 4B, an insulation material 54 is formed over the substrate 50 and between neighboring fins 55. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 55. Although the insulation material 54 is illustrated as a single layer, some embodiments may utilize multiple layers. For example, in some embodiments a liner (not separately illustrated) may first be formed along a surface of the substrate 50 and the fins 55. Thereafter, a fill material, such as those discussed above may be formed over the liner. In FIG. 4A, the insulation material 54 is illustrated as having squared corners. However, the insulation material 54 may have rounded corners, and bottom portions of the insulation material 54 may be U-shaped (as illustrated in FIG. 4B), V-shaped, or the like.

Figure 5A:
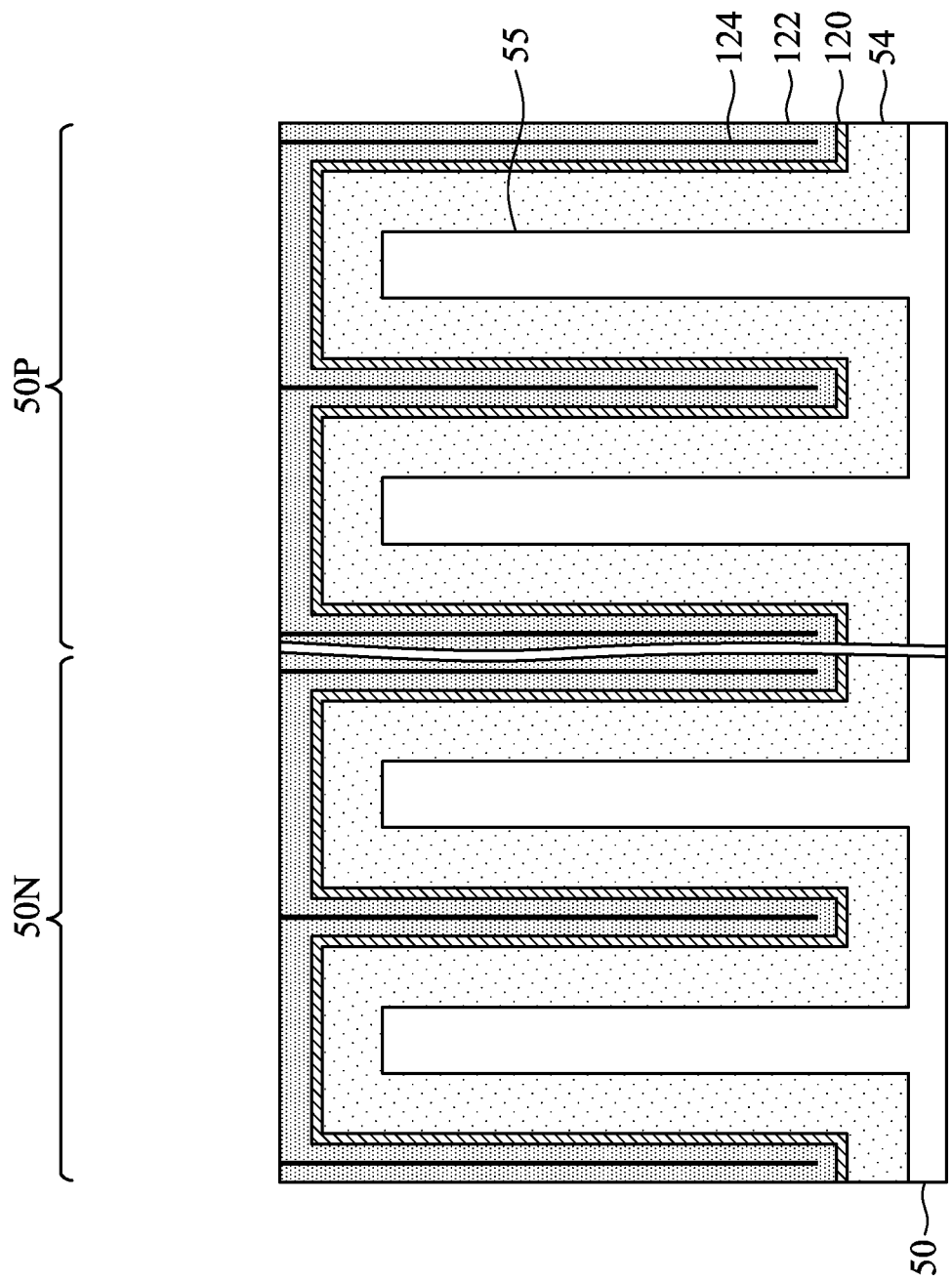
Figure 5B:
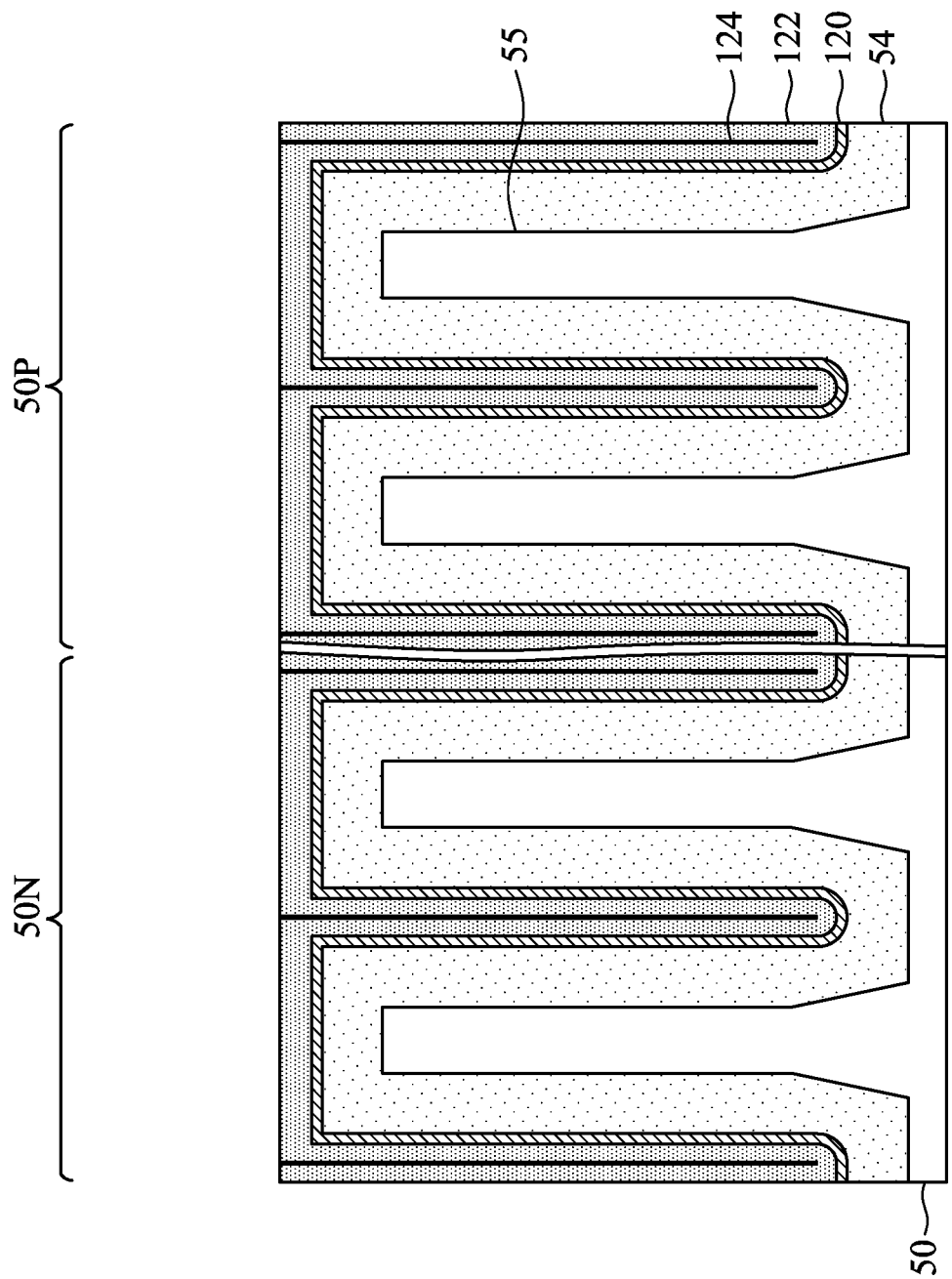

In FIGS. 5A and 5B, a first liner layer 120 and a first fill material 122 are formed over the insulation material 54. The first liner layer 120 and the first fill material 122 may be formed of dielectric material, and may be deposited by any suitable method, such as atomic layer deposition (ALD), CVD, or the like. The first liner layer 120 may be formed of a dielectric material having a high etch selectivity relative to materials of the insulation material 54, and the first fill material 122 may be formed of a dielectric material having a high etch selectivity relative to materials of the first liner layer 120. In some embodiments, the first liner layer 120 and the first fill material 122 may be formed of silicon carbon nitride, with the first liner layer 120 having a concentration of carbon ranging from about 2 at. % to about 10 at. % and the first fill material 122 having a concentration of carbon ranging from about 12 at. % to about 30 at. %. In some embodiments, the first liner layer 120 may include silicon carbide (SiC), silicon carbonitride (SiCN), silicon nitride (SiN), or the like and the first fill material 122 may include silicon carbide, silicon carbonitride, silicon nitride, or the like. In some embodiments, precursors for the first liner layer 120 and the first fill material 122 may include dichlorosilane (DCS, $SiH_2Cl_2$), propene ($C_3H_6$), ammonia ($NH_3$), combinations thereof, or the like.

As illustrated in FIGS. 5A and 5B, a seam 124 may be formed during the deposition of the first fill material 122. The seam 124 may result in a dielectric fin structure (such as the dielectric fin structure 136, discussed below with respect to FIGS. 10A and 10B) having reduced etch resistance and may lead to the dielectric fin structure being damaged. Removing or reducing the size of the seam 124 may result in improved etch resistance of the dielectric fin structure, reduced bridging between epitaxial structures (such as the epitaxial source/drain regions 92, discussed below with respect to FIGS. 17A through 17E), reduced cut gate failures, and overall reduced device defects.

Figure 6A:
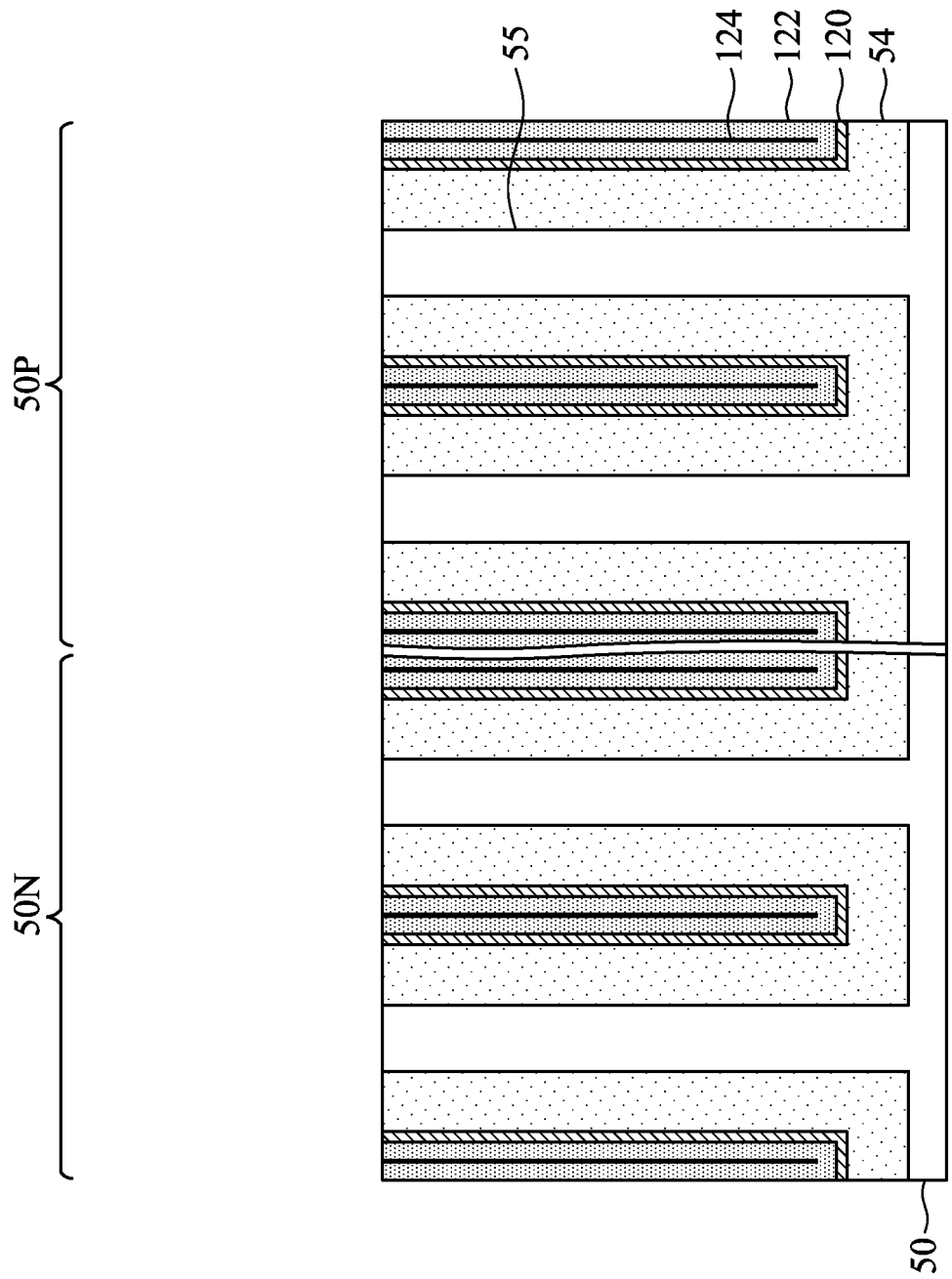
Figure 6B:
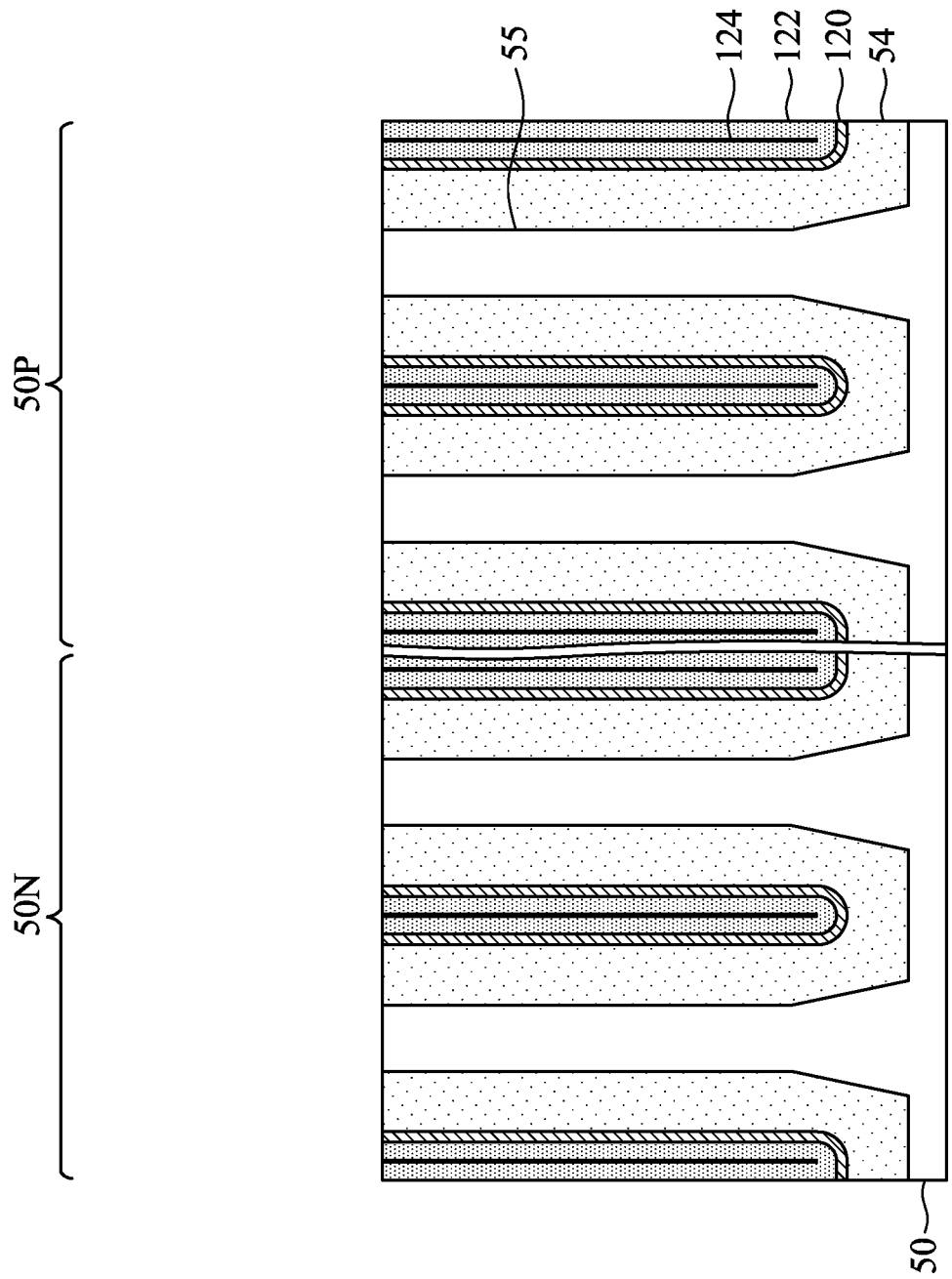

In FIGS. 6A and 6B, a removal process is performed on the insulation material 54, the first liner layer 120, and the first fill material 122 to remove excess materials of the insulation material 54, the first liner layer 120, and the first fill material 122 over the fins 55. In some embodiments, a planarization process such as a chemical mechanical polish (CMP), an etch-back process, combinations thereof, or the like may be utilized. The planarization process exposes the fins 55 such that top surfaces of the fins 55, the insulation material 54, the first liner layer 120, and the first fill material 122 are level after the planarization process is complete. In embodiments in which a mask remains on the fins 55, the planarization process may expose the mask or remove the mask such that top surfaces of the mask or the fins 55, the insulation material 54, the first liner layer 120, and the first fill material 122 are level after the planarization process is complete.

Figure 7A:
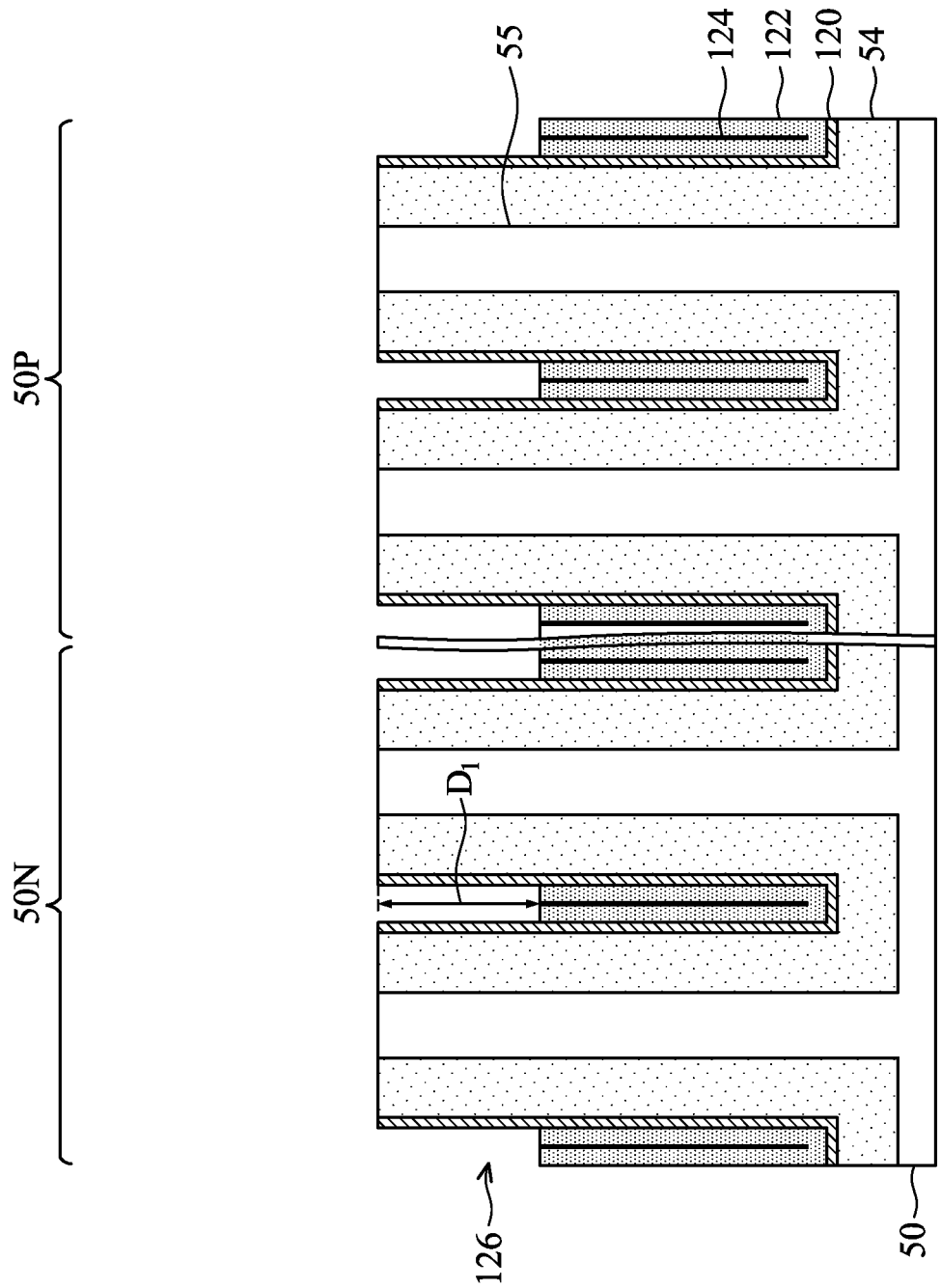
Figure 7B:
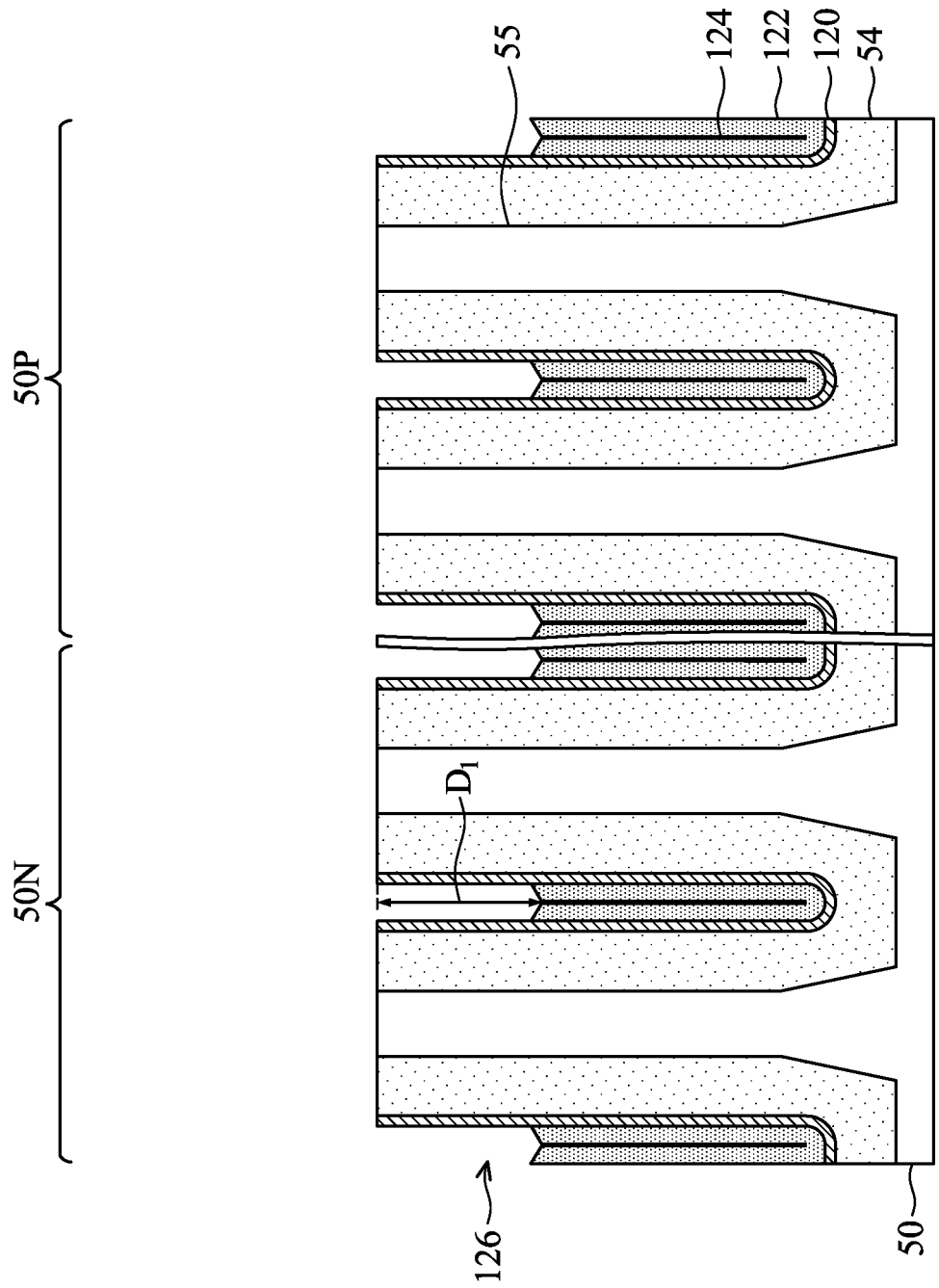

In FIGS. 7A and 7B, an etch-back process is performed on the first fill material 122. The etch-back process forms openings 126 over the first fill material 122 between opposite sidewalls of the first liner layer 120. The first fill material 122 may be etched back using an acceptable etching process, such as one that is selective to the material of the first fill material 122 (e.g., etches the material of the first fill material 122 at a faster rate than the materials of the fins 55, the first liner layer 120, and the insulation material 54). In some embodiments, a dry etching process, such as a dry etching process using etchants comprising $CF_x$, $C_xF_y$, or the like, may be used. In some embodiments, a wet etching process may be used. The first fill material 122 may be etched back a distance $D_1$ below top surfaces of the insulation material 54, the first liner layer 120, and the fins 55 ranging from about 2 nm to about 10 nm.

Figure 8A:
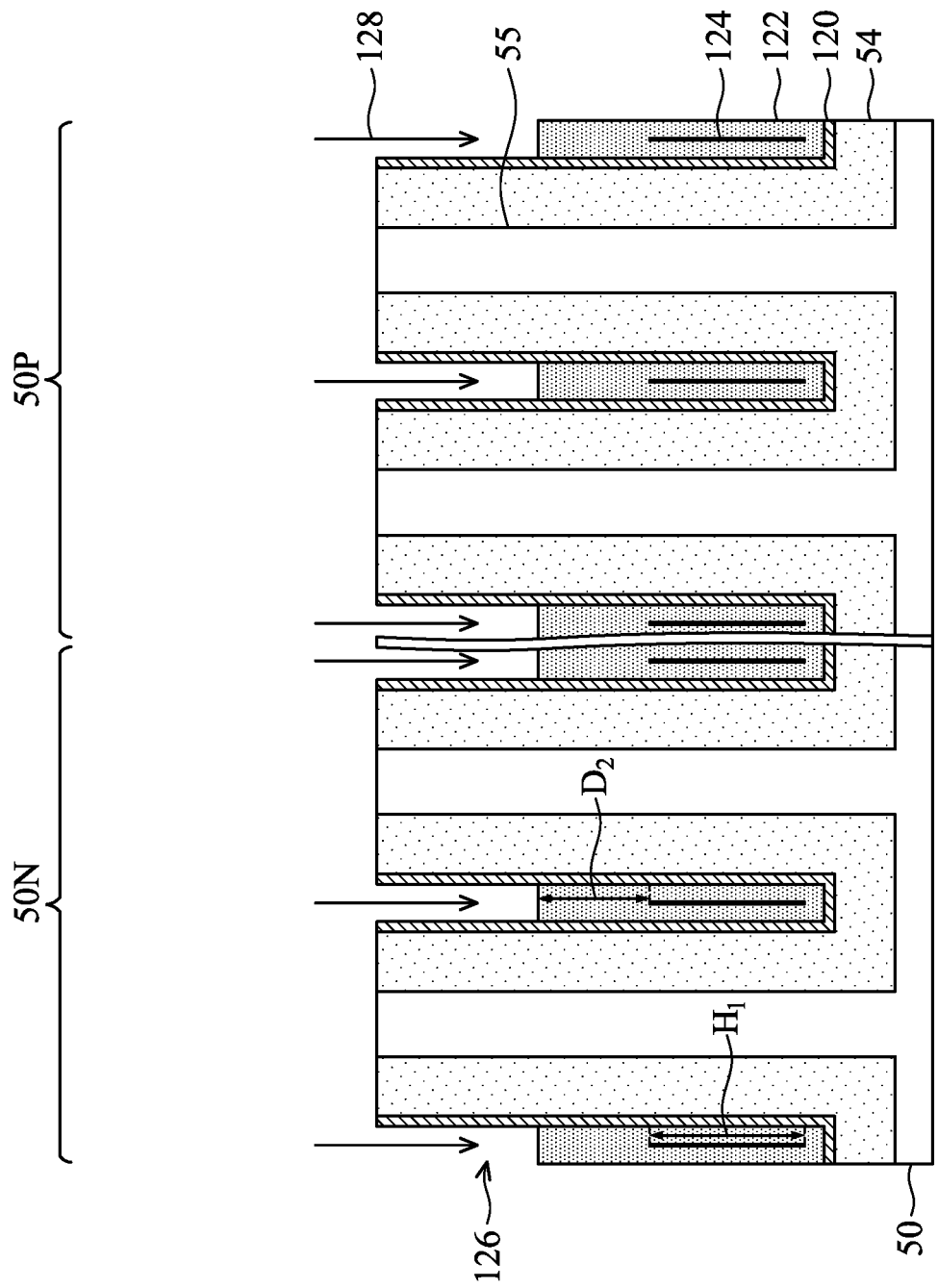
Figure 8B:
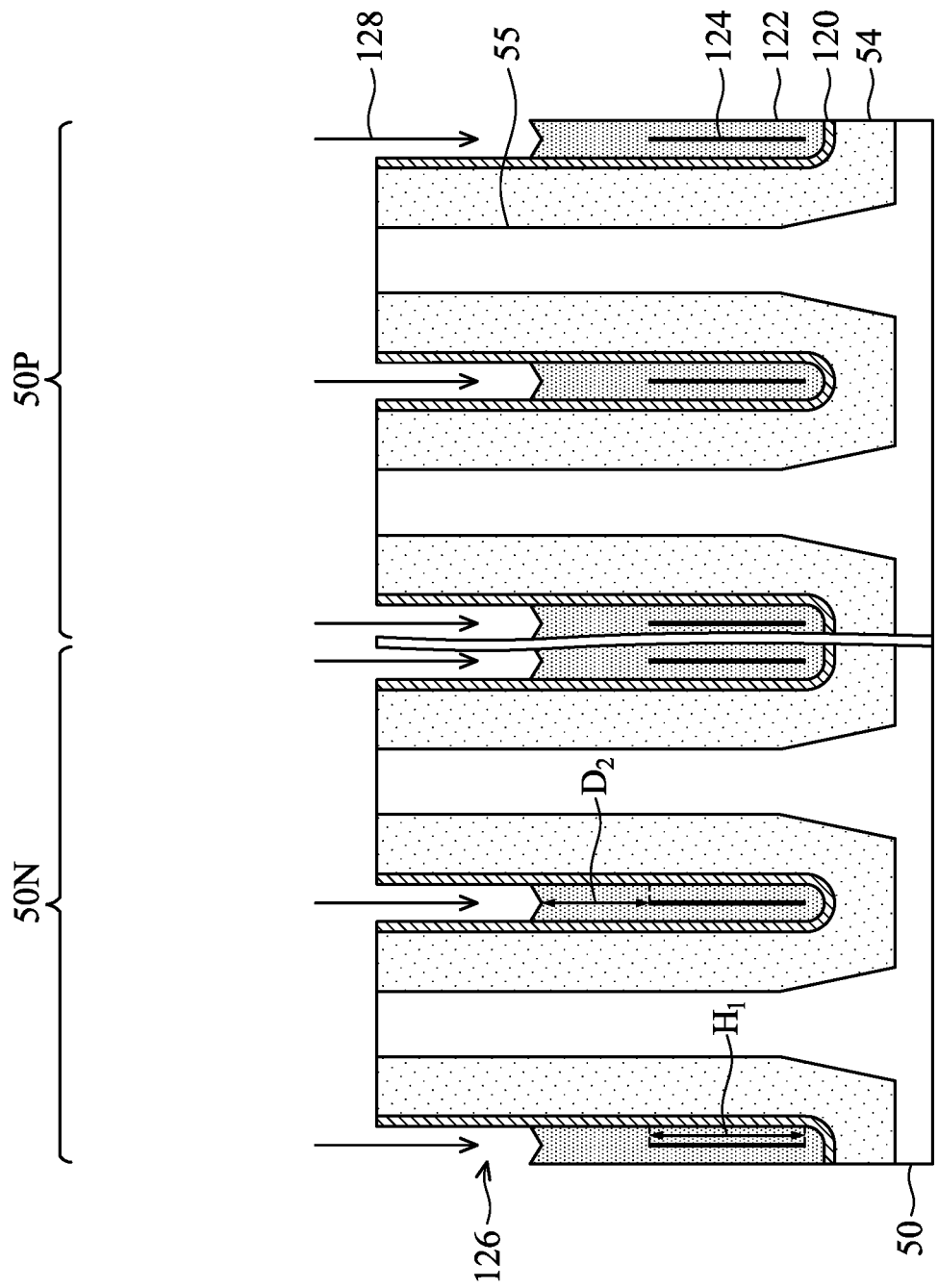

In FIGS. 8A and 8B, an implantation process is performed on the first fill material 122. The implantation process is performed to implant dopants 128 into the first fill material 122. In some embodiments, the dopants 128 may include nitrogen, argon, combinations thereof, or the like. The dopants 128 may be implanted to a depth $D_2$ below top surfaces of the first fill material 122 ranging from about 10 nm to about 50 nm. A dosage for the implantation process may range from about 1 atoms/cm$^2$ to about 100 atoms/cm$^2$. The implantation process may be performed at a temperature ranging from about 25° C. to about 400° C. with an applied energy ranging from about 5 keV to about 30 keV. Following the implantation process, a concentration of the dopant in the portion of the first fill material 122 exposed to the implantation process may range from about 1 at. % to about 30 at. %. A concentration of carbon in a portion of the first fill material 122 exposed to the implantation process may be reduced by the implantation process, and may range from about 12 at. % to about 30 at. % after the implantation process is performed. The concentration of carbon in the portion of the first fill material 122 exposed to the implantation process may be less than the concentration of carbon in the portion of the first fill material 122 that was not exposed to the implantation process. Similarly, a concentration of silicon in the portion of the first fill material 122 exposed to the implantation process may be less than the concentration of silicon in the portion of the first fill material 122 that was not exposed to the implantation process.

Performing the implantation process on the first fill material 122 causes the seam 124 to be eliminated from the portion of the first fill material 122 exposed to the implantation process. Specifically, the implantation process breaks bonds in the first fill material 122 and causes re-bonding in the first fill material 122, which eliminates the seam 124. As illustrated in FIGS. 8A and 8B, in some embodiments, a portion of the first fill material 122 may not be exposed to the implantation process, and the seam 124 may remain in this portion of the first fill material 122. The remaining portion of the seam 124 may have a height $H_1$ ranging from about 5 nm to about 40 nm. In some embodiments, the first fill material 122 may be etched back further in the process of FIGS. 7A and 7B so that the seam 124 is completely eliminated by the process of FIGS. 8A and 8B. In some embodiments, the implantation process may be performed with a greater applied energy or for a longer time period to completely eliminate the seam 124. Eliminating the seam 124 in at least the upper portions of the first fill material 122 improves the etch resistance of the first fill material 122. This reduces undesired etching of the first fill material 122, prevents bridging between epitaxial structures, reduces cut gate failures, and reduces device defects.

Figure 9A:
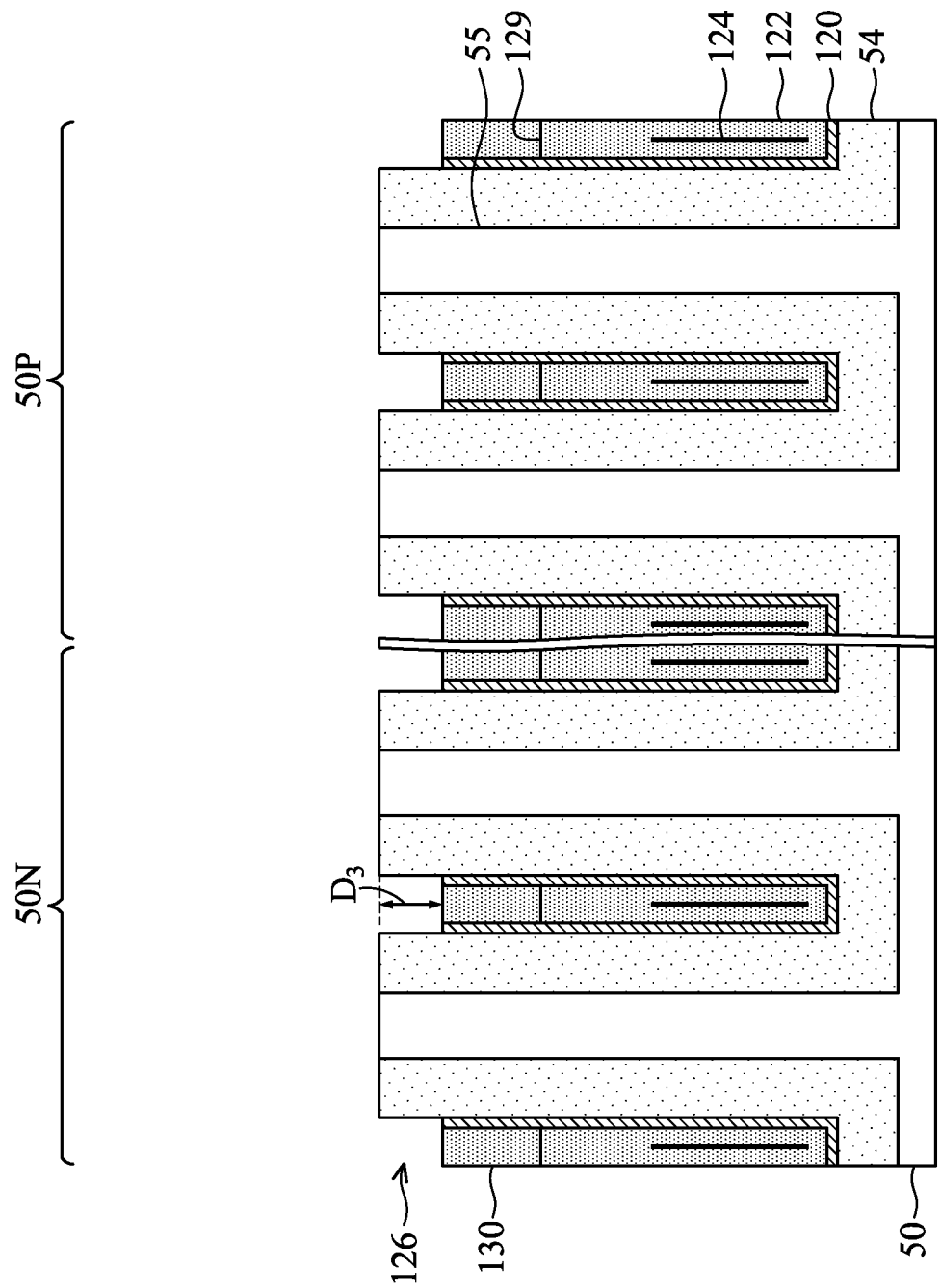
Figure 9B:
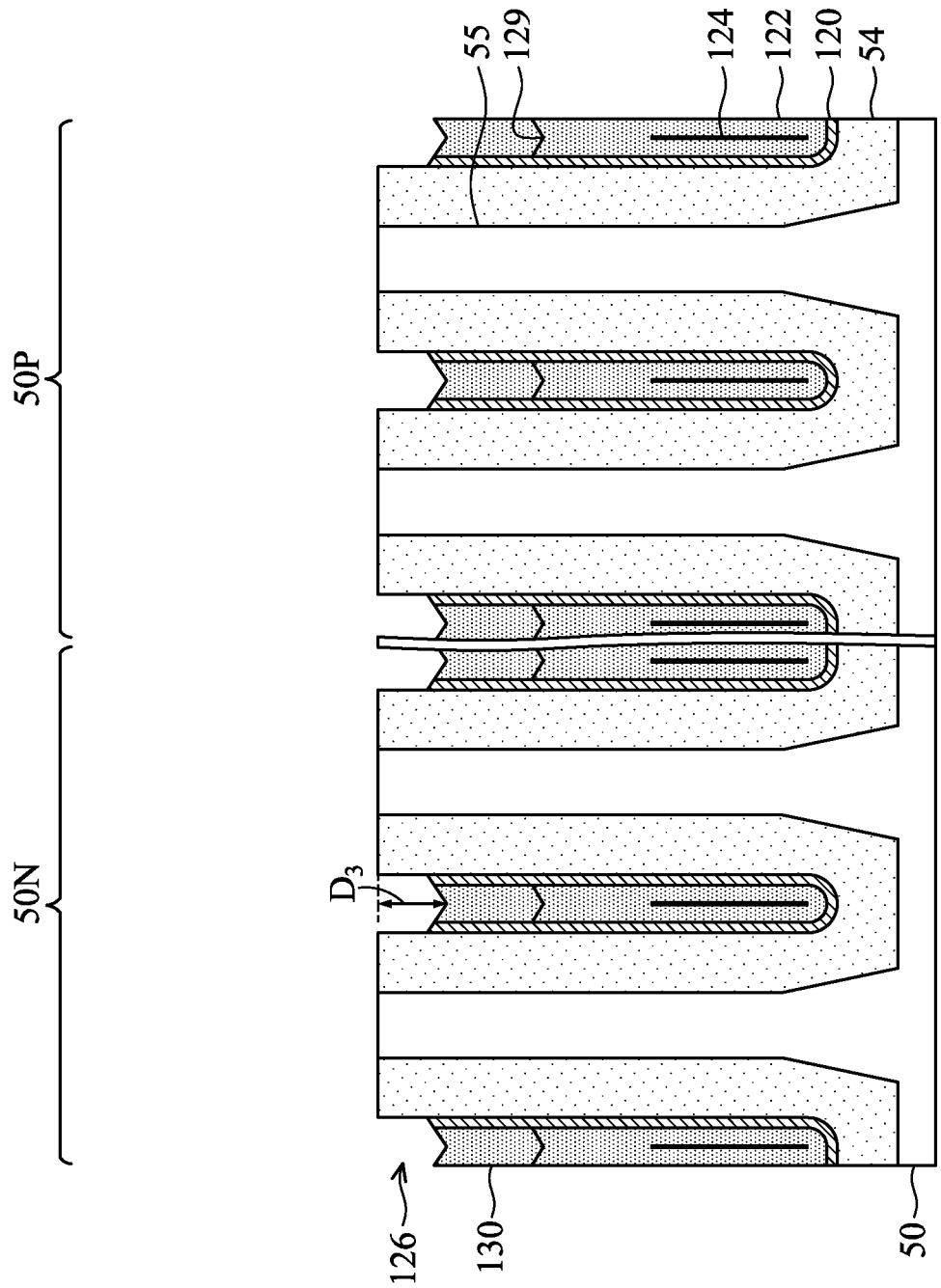

In FIGS. 9A and 9B, a second fill material 130 is formed in the openings 126 over the first fill material 122. The second fill material 130 may be formed of materials and by methods the same as or similar to those used to form the first fill material 122, discussed above with respect to FIGS. 5A and 5B. An interface 129 may be formed between the second fill material 130 and the first fill material 122. The interface may be substantially planar as illustrated in FIG. 9A, V-shaped as illustrated in FIG. 9B, U-shaped, or the like. In some embodiments, the second fill material 130 may be formed of silicon carbon nitride having a concentration of carbon ranging from about 12 at. % to about 25 at. %. In some embodiments, the second fill material 130 may include silicon carbonitride (SiCN), silicon nitride (SiN), silicon carbide (SiC), or the like. After the second fill material 130 is deposited, a removal process the same as or similar to the removal process discussed above with respect to FIGS. 6A and 6B may be performed on the second fill material 130 such that top surfaces of the second fill material 130 are level with top surfaces of the fins 55, the insulation material 54, and the first liner layer 120.

An etch-back process similar to the etch-back process discussed above with respect to FIGS. 7A and 7B may be performed on the second fill material 130 and the first liner layer 120. The second fill material 130 and the first liner layer 120 may be etched back a distance $D_3$ below top surfaces of the insulation material 54, the first liner layer 120, and the fins 55 ranging from about 5 nm to about 50 nm. The second fill material 130 and the first liner layer 120 may be etched back using an etching process that is selective to the materials of the second fill material 130 and the first liner layer 120 (e.g., etches the material of the second fill material 130 and the first liner layer 120 at faster rates than the materials of the fins 55 and the insulation material 54). In some embodiments, a dry etching process, such as a dry etching process using etchants comprising $CF_x$, $C_xF_y$, or the like, may be used. In some embodiments, a wet etching process may be used.

An implantation process the same as or similar to the implantation process discussed above with respect to FIGS. 8A and 8B is performed to implant the above-described dopant into the second fill material 130. The second fill material 130 may be deposited with a seam similar to or the same as the seam 124 formed in the first fill material 122. Performing the implantation process on the second fill material 130 breaks bonds and causes re-bonding in the second fill material 130, which eliminates the seam formed in the second fill material 130. Following the ion implantation, a concentration of carbon in the second fill material 130 may be reduced, and may range from about 12 at. % to about 20 at. %. A concentration of the dopant in the second fill material 130 may range from about 0.1 at. % to about 5 at. %. Concentrations of carbon and silicon in the second fill material 130 may be the same as concentrations of carbon and silicon in the portion of the first fill material 122 exposed to the implantation process and less than concentrations of carbon and silicon in the portion of the first fill material 122 that was not exposed to the implantation process. The second fill material 130 may have a height less than the height of the first fill material 122 after the second fill material 130 is etched back, such that performing the implantation process on the second fill material 130 completely eliminates the seam formed in the second fill material 130. Eliminating the seam in the second fill material 130 improves the etch resistance of the second fill material 130. This reduces undesired etching of the second fill material 130, prevents bridging between epitaxial structures, reduces cut gate failures, and reduces device defects.

Figure 10A:
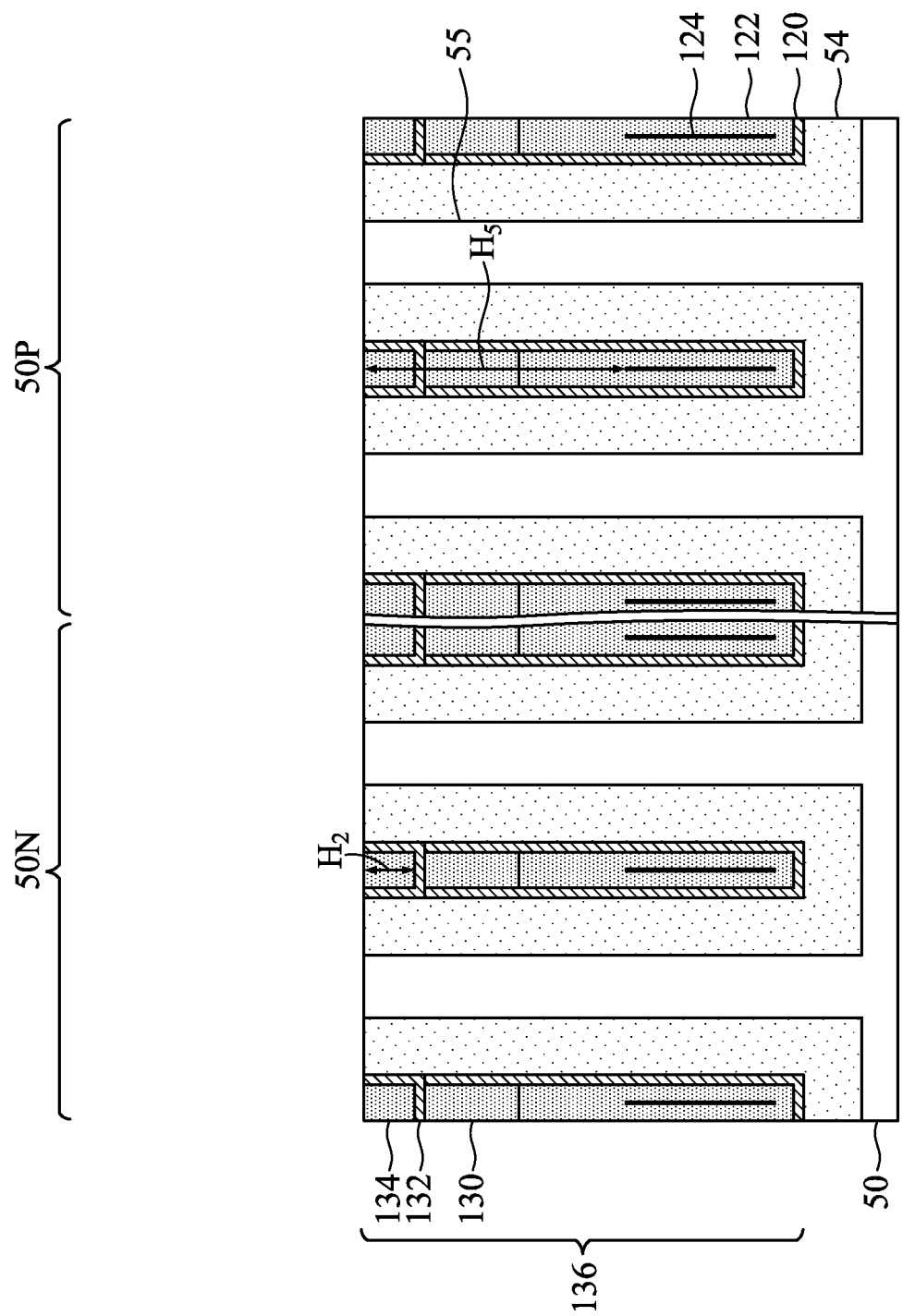
Figure 10B:
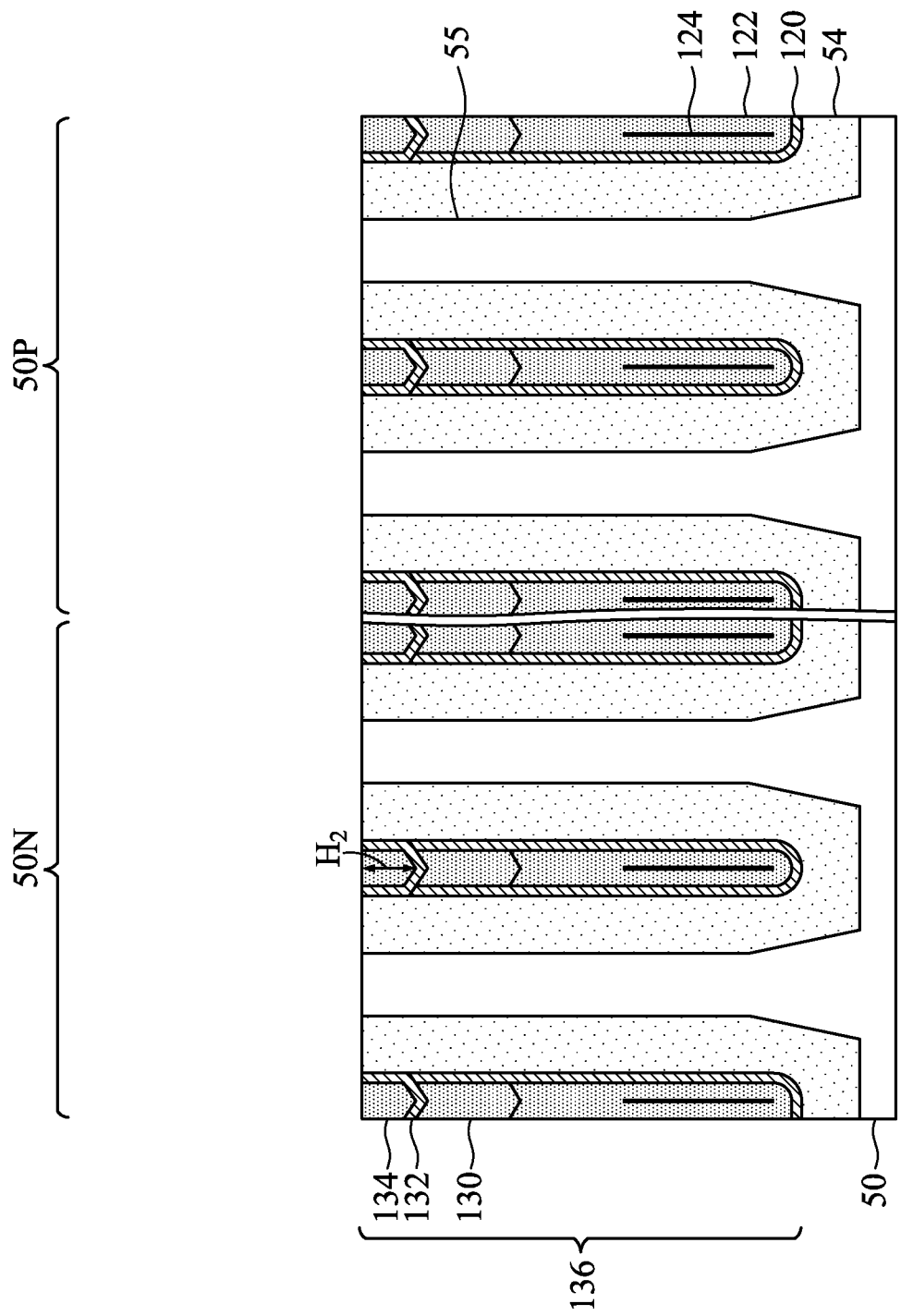

In FIGS. 10A and 10B, a second liner layer 132 and a third fill material 134 are formed in the openings 126 over the second fill material 130 and the first liner layer 120. The second liner layer 132 and the third fill material 134 may fill the openings 126. The second liner layer 132 may be formed of materials and by methods the same as or similar to those used to form the first liner layer 120, discussed above with respect to FIGS. 5A and 5B. The third fill material 134 may be formed of materials and by methods the same as or similar to those used to form the first fill material 122, discussed above with respect to FIGS. 5A and 5B. In some embodiments, the second liner layer 132 may be formed of silicon carbon nitride having a concentration of carbon ranging from about 2 at. % to about 10 at. % and the third fill material 134 may be formed of silicon carbon nitride having a concentration of carbon ranging from about 12 at. % to about 20 at. %. In some embodiments, the second liner layer 132 may include silicon carbonitride (SiCN), silicon nitride (SiN), silicon carbide (SiC), or the like and the third fill material 134 may include silicon carbonitride, silicon nitride, silicon carbide, or the like. After the second liner layer 132 and the third fill material 134 are deposited, a removal process the same as or similar to the removal process discussed above with respect to FIGS. 6A and 6B may be performed on the second liner layer 132 and the third fill material 134 such that top surfaces of the second liner layer 132 and the third fill material 134 are level with top surfaces of the fins 55 and the insulation material 54. The first liner layer 120, the first fill material 122, the second fill material 130, the second liner layer 132, and the third fill material 134 may be collectively referred to as dielectric fin structures 136. Each of the dielectric fin structures 136 may have a lengthwise direction parallel to lengthwise directions of the respective fins 55.

The third fill material 134 may be formed without a seam, even though the above-described implantation process may not be performed on the third fill material 134. The third fill material 134 may have a height $H_2$ ranging from about 5 nm to about 50 nm, which is sufficiently small such that a seam is not formed in the third fill material 134 when the third fill material 134 is deposited. The dielectric fin structures 136 may have seam-free heights $H_5$ above the seams 124 ranging from about 5 nm to about 50 nm. In some embodiments, the third fill material 134 may be deposited with a carbon concentration greater than carbon concentrations of the first fill material 122 and the second fill material 130. As such, the third fill material 134 may have improved etch resistance. In some embodiments, the carbon concentration in the third fill material 134 may be the same as the carbon concentration in the portion of the first fill material 122 that is not exposed to the implantation process, and greater than the carbon concentrations of the second fill material 130 and the portion of the first fill material 122 that is exposed to the implantation process. In some embodiments, a silicon concentration in the third fill material 134 may be the same as a silicon concentration in the portion of the first fill material 122 that is not exposed to the implantation process and less than silicon concentrations of the portion of the first fill material 122 that is exposed to the implantation process and the second fill material 130. Eliminating seams from the dielectric fin structures 136 improves the etch resistance of the dielectric fin structures 136. This reduces undesired etching of the dielectric fin structures 136, prevents bridging between epitaxial structures, reduces cut gate failures, and reduces device defects.

Figure 11:
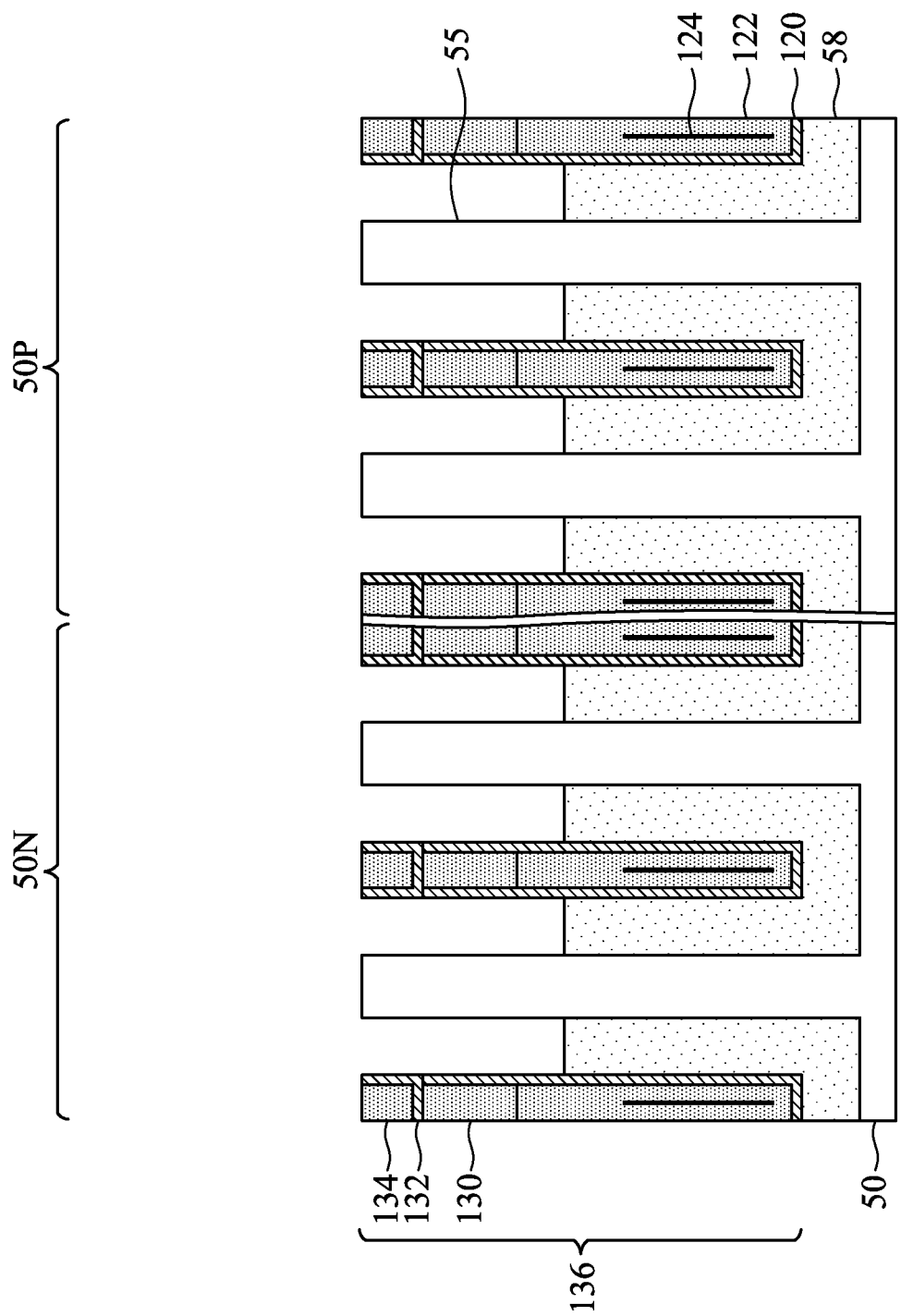

In FIG. 11, the insulation material 54 is recessed to form shallow trench isolation (STI) regions 58. The insulation material 54 is recessed such that upper portions of the fins 55 and the dielectric fin structures 136 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material 54 (e.g., etches the material of the insulation material 54 at a faster rate than the material of the fins 55 and the dielectric fin structures 136). For example, an oxide removal using, for example, dilute hydrofluoric (dHF) acid may be used.

The process described with respect to FIGS. 2 through 11 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 55. In some embodiments, heteroepitaxial structures can be used for the fins 55. For example, the fins 55 in FIGS. 10A and 10B can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In some embodiments, upper portions of the fins 55 may be formed from silicon-germanium ($Si_xG_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 11, appropriate wells (not separately illustrated) may be formed in the fins 55 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not separately illustrated). For example, a photoresist may be formed over the fins 55 and the STI regions 58 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $1 \times 10^{18}$ atoms/cm$^3$, such as between about $1 \times 10^{16}$ atoms/cm$^3$ and about $1 \times 10^{18}$ atoms/cm$^3$. After the implant, the photoresist is removed, such as by an acceptable ashing process.

Following the implanting of the p-type region 50P, a photoresist is formed over the fins 55 and the STI regions 58 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $1 \times 10^{18}$ atoms/cm$^3$, such as between about $1 \times 10^{16}$ atoms/cm$^3$ and about $1 \times 10^{18}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 12:
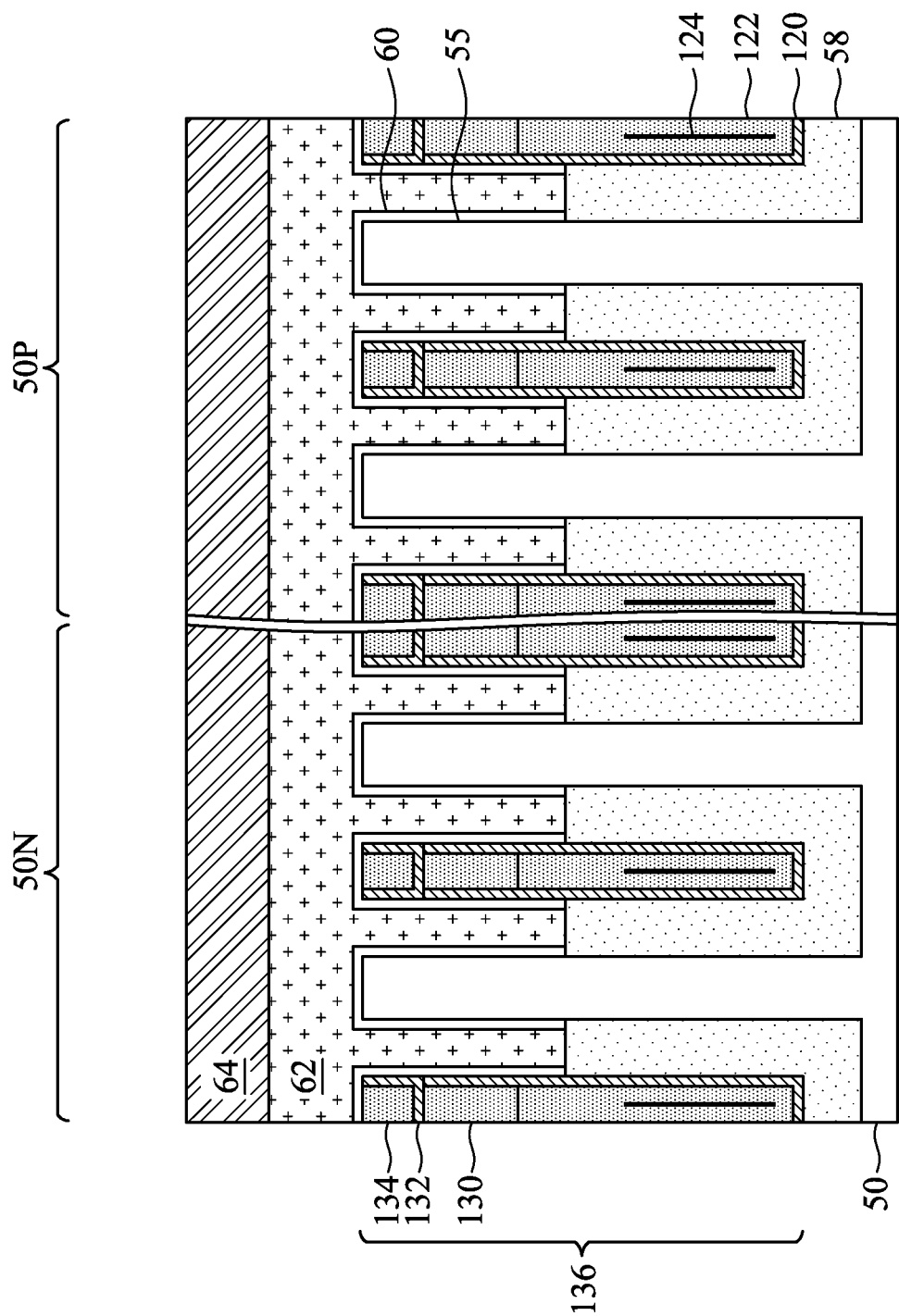

In FIG. 12, dummy dielectric layers 60 are formed on the fins 55 and the dielectric fin structures 136. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the n-type region 50N and the p-type region 50P. It is noted that the dummy dielectric layers 60 are shown covering only the fins 55 and the dielectric fin structures 136 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 13A through 30C illustrate various additional steps in the manufacturing of embodiment devices. FIGS. 13A through 30C illustrate features in either of the n-type region 50N or the p-type region 50P. For example, the structures illustrated in FIGS. 13A through 30C may be applicable to both the n-type region 50N and the p-type region 50P. Differences (if any) in the structures of the n-type region 50N and the p-type region 50P are described in the text accompanying each figure.

Figures 13A, 13B:
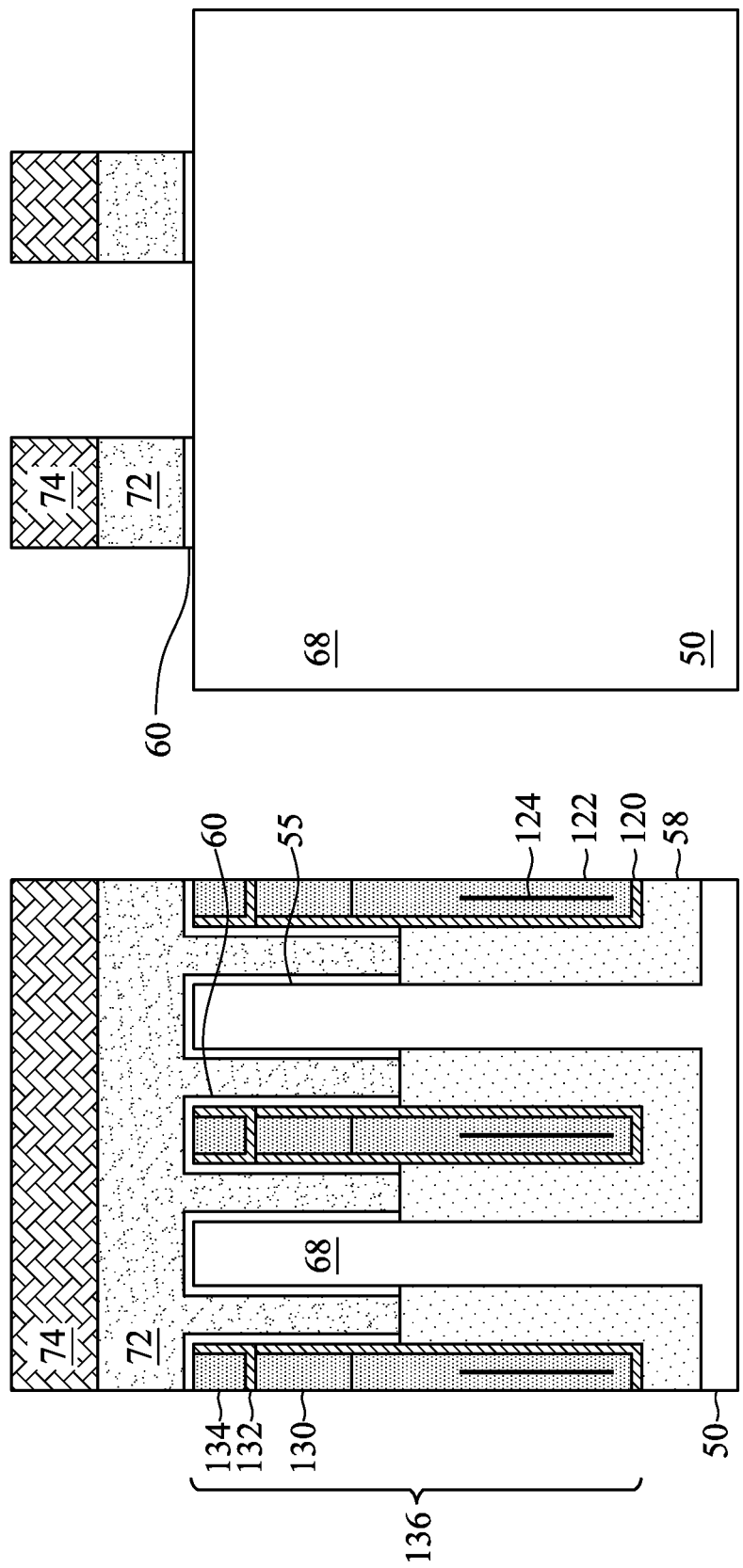

In FIGS. 13A and 13B, the mask layer 64 (see FIG. 12) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates. The dummy gates 72 may also have a lengthwise direction substantially perpendicular to the lengthwise direction of respective fins 55 and respective dielectric fin structures 136. The dummy dielectric layers 60, the dummy gates 72, and the masks 74 may be collectively referred to as "dummy gate stacks."

Figures 14A, 14B:
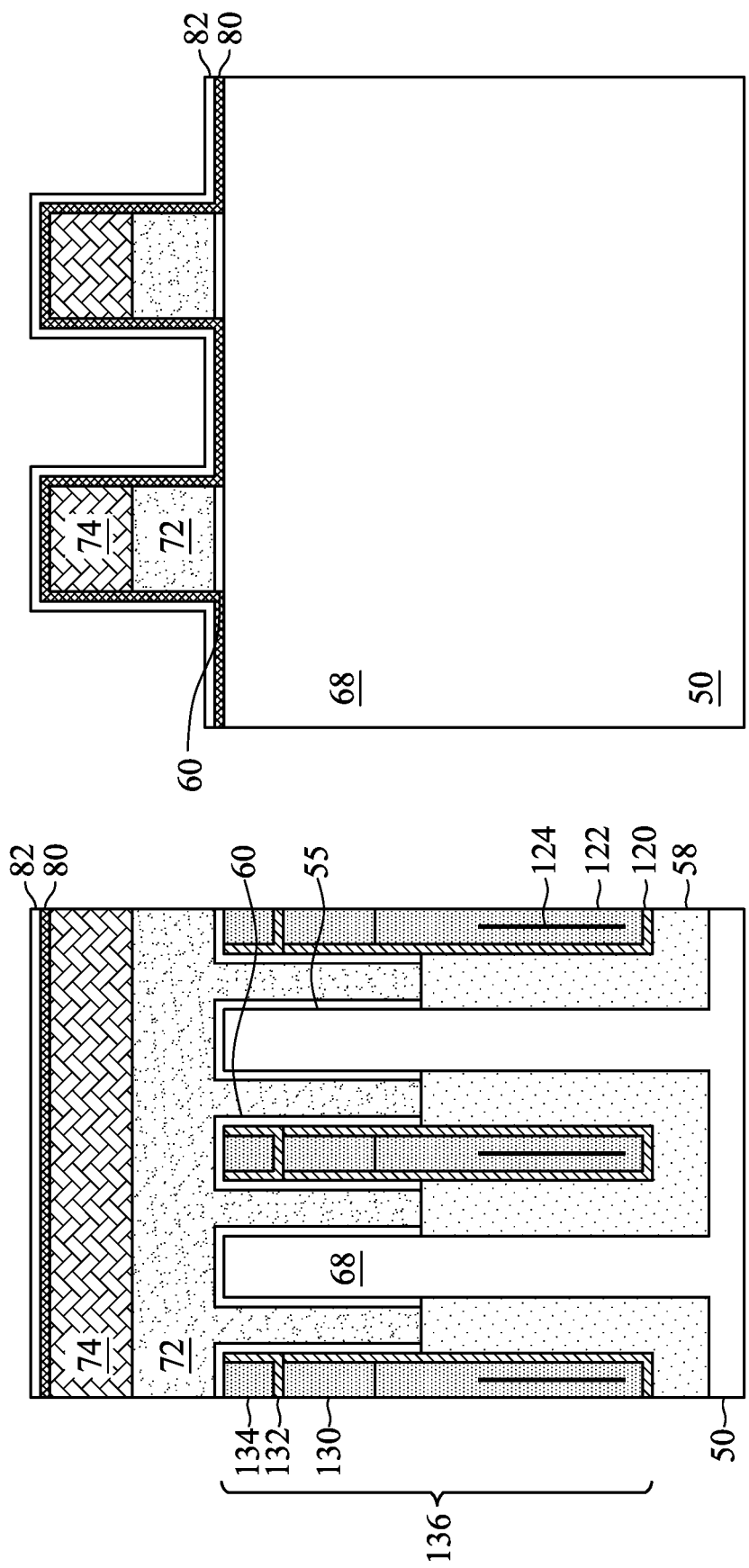
Figure 14C:
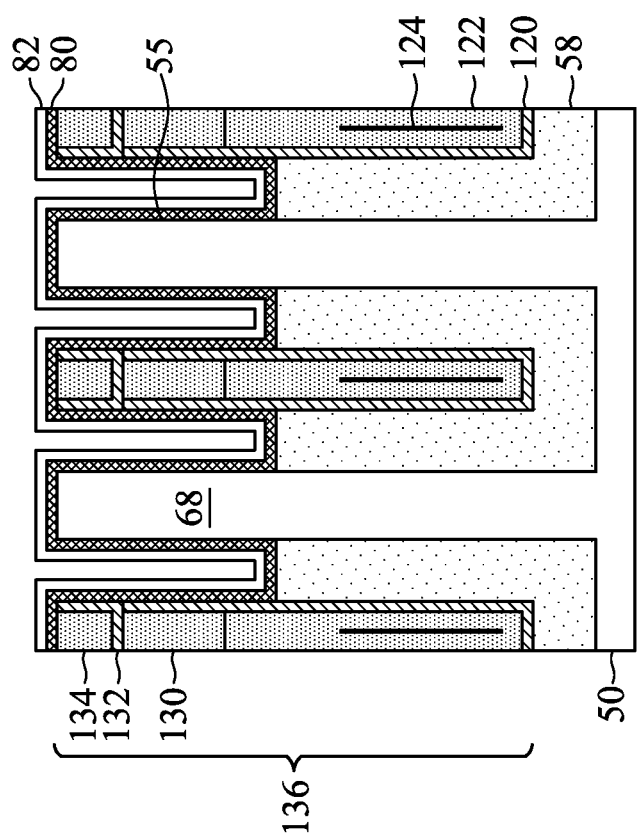

In FIGS. 14A through 14C, a first spacer layer 80 and a second spacer layer 82 are formed over the structures illustrated in FIGS. 13A and 13B. In FIGS. 14A through 14C, the first spacer layer 80 is formed on top surfaces of the STI regions 58; top surfaces and sidewalls of the fins 55, the dielectric fin structures 136, and the masks 74; and sidewalls of the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 15B:
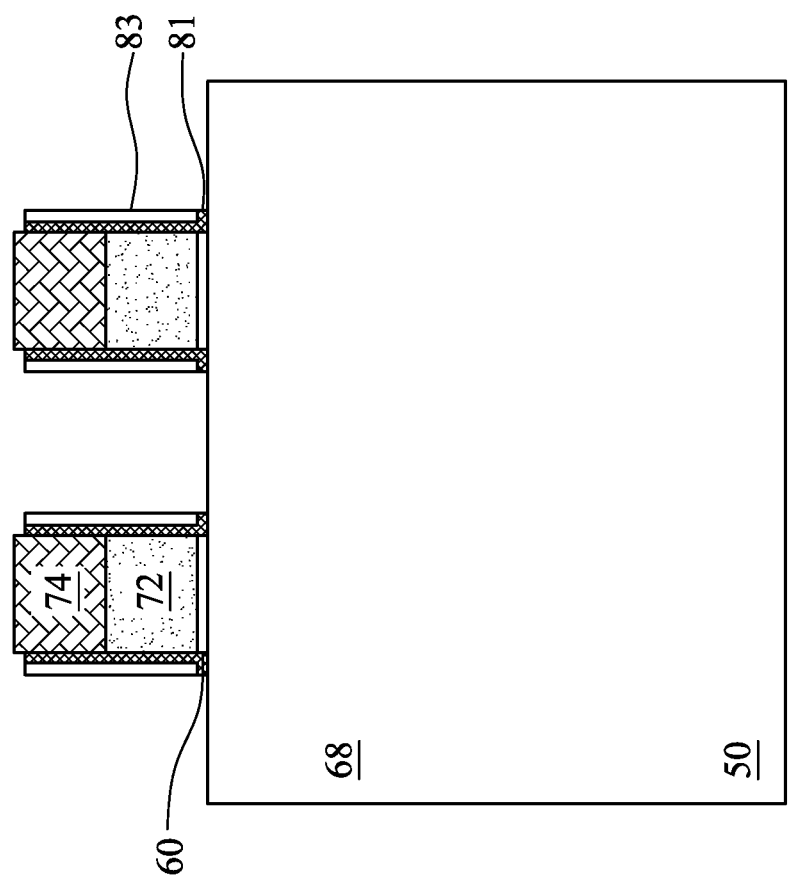
Figure 15A:
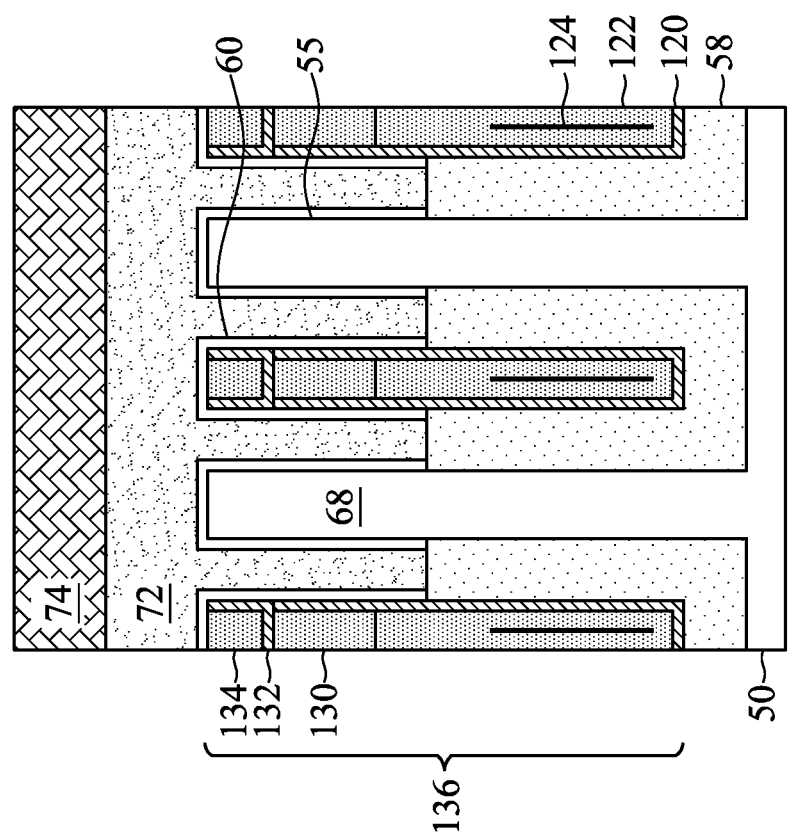
Figure 15C:
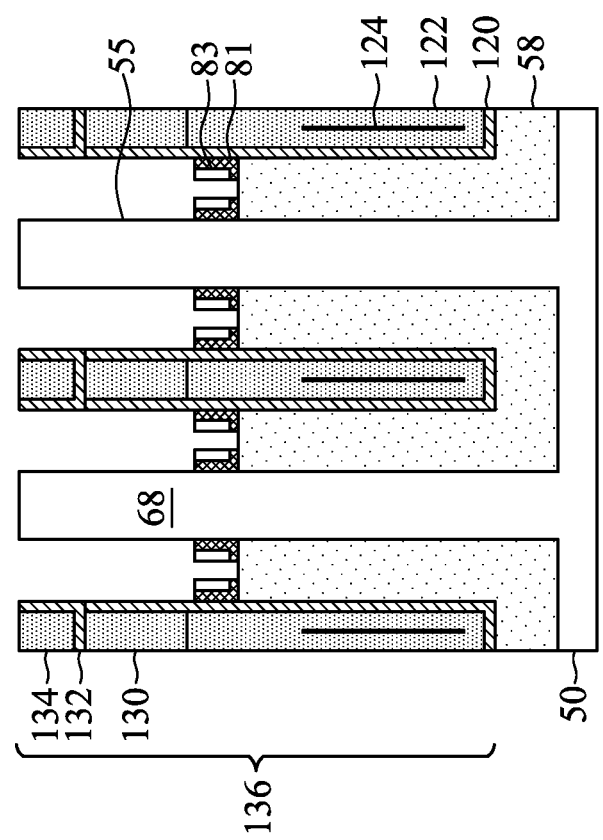

In FIGS. 15A through 15C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the fins 55, the dielectric fin structures 136, the dummy dielectric layers 60, the dummy gates 72, and the masks 74. The first spacers 81 and the second spacers 83 may have different heights adjacent the fins 55/dielectric fin structures 136 and the dummy gate stacks due to the etching processes used to etch the first spacer layer 80 and the second spacer layer 82, as well as different heights between the fins 55/dielectric fin structures 136 and the dummy gate stacks. Specifically, as illustrated in FIGS. 15B and 15C, in some embodiments, the first spacers 81 and the second spacers 83 may extend partially up sidewalls of the fins 55, the dielectric fin structures 136, and the dummy gate stacks. In some embodiments, the first spacers 81 and the second spacers 83 may extend to top surfaces of the dummy gate stacks.

After the first spacers 81 and the second spacers 83 are formed, implants for lightly doped source/drain (LDD) regions (not separately illustrated) may be performed. In embodiments with different device types, similar to the implants discussed above in FIG. 11, a mask, such as a photoresist, may be formed over the n-type region 50N, while exposing the p-type region 50P, and appropriate type (e.g., p-type) impurities may be implanted into the exposed fins 55 and the substrate 50 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 55 and the substrate 50 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like). Furthermore, the n-type and p-type devices may be formed using a different structures and steps.

Figure 16B:
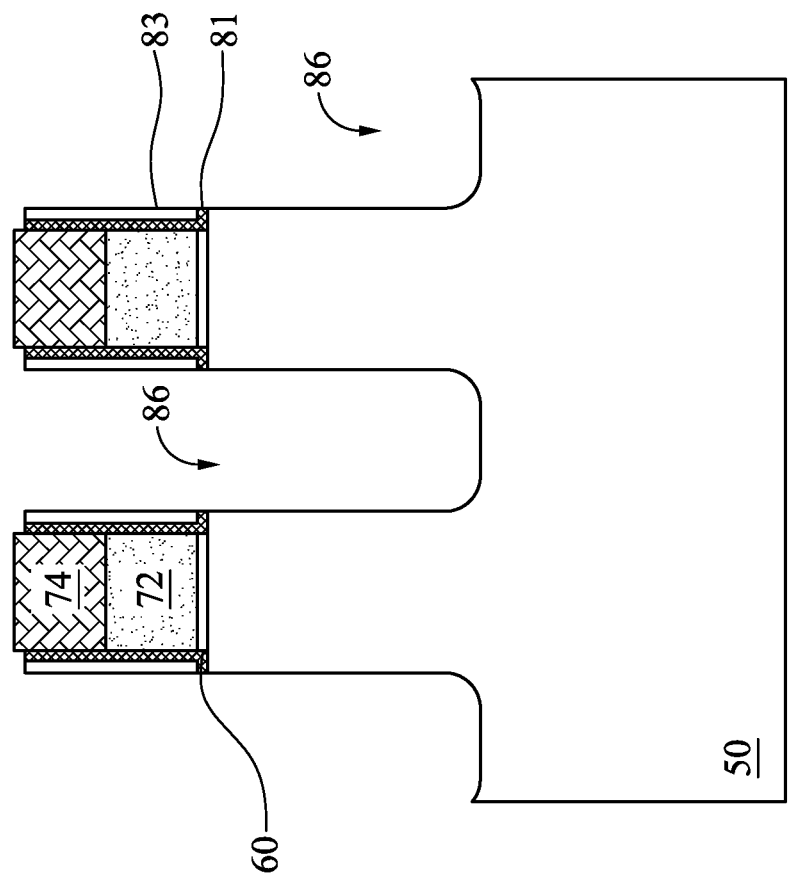
Figure 16A:
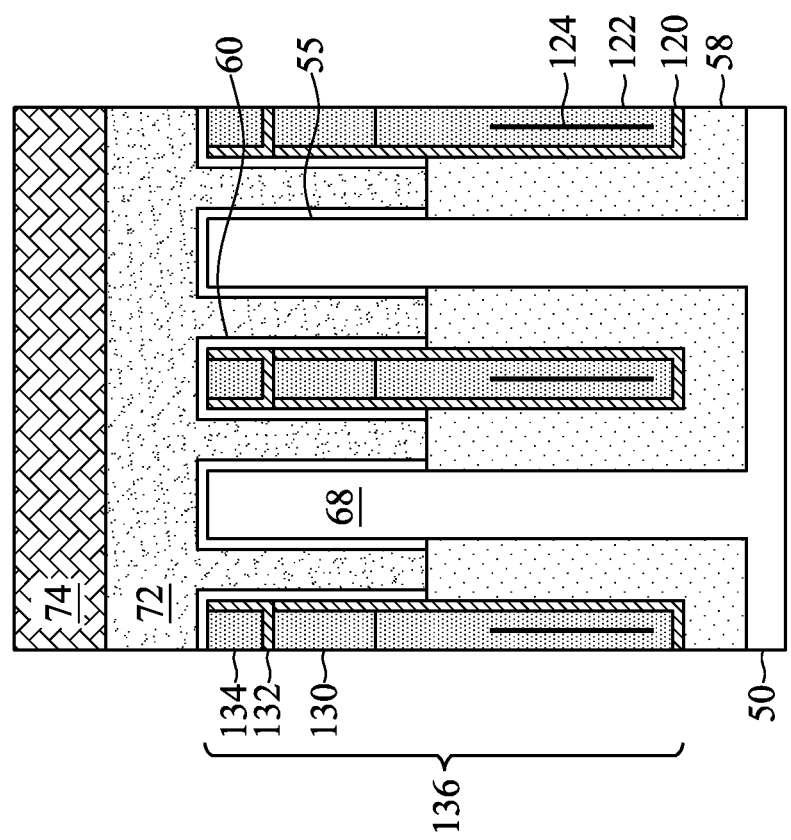
Figure 16C:
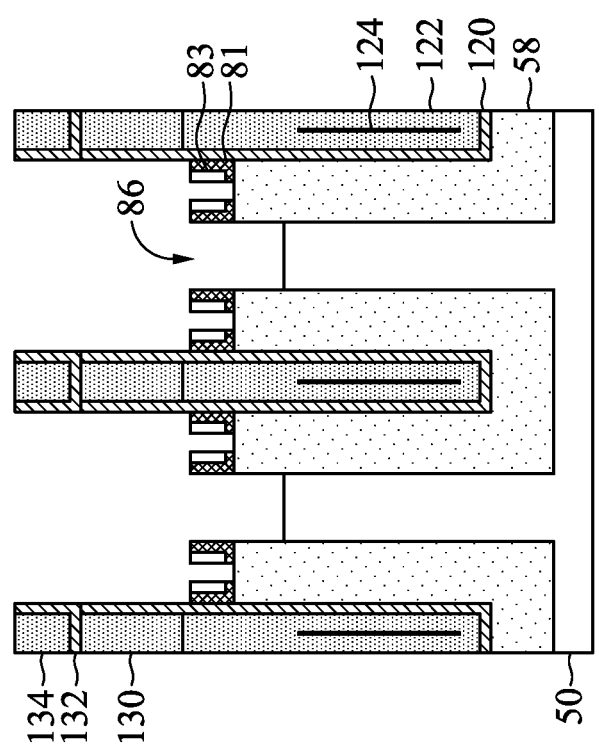

In FIGS. 16A through 16C, the fins 55 are etched to form first recesses 86. As illustrated in FIG. 16C, top surfaces of the fins 55 may be below top surfaces of the STI regions 58. In some embodiments, bottom surfaces of the first recesses 86/top surfaces of the fins 55 are disposed above or level with the top surfaces of the STI regions 58. The fins 55 are etched using anisotropic etching processes, such as RIE, NBE, or the like. The first spacers 81, the second spacers 83, and the masks 74 mask portions of the fins 55 during the etching processes used to form the first recesses 86. A single etch process or multiple etch processes may be used to form the first recesses 86. Timed etch processes may be used to stop the etching of the first recesses 86 after the first recesses 86 reach a desired depth.

Figure 17B:
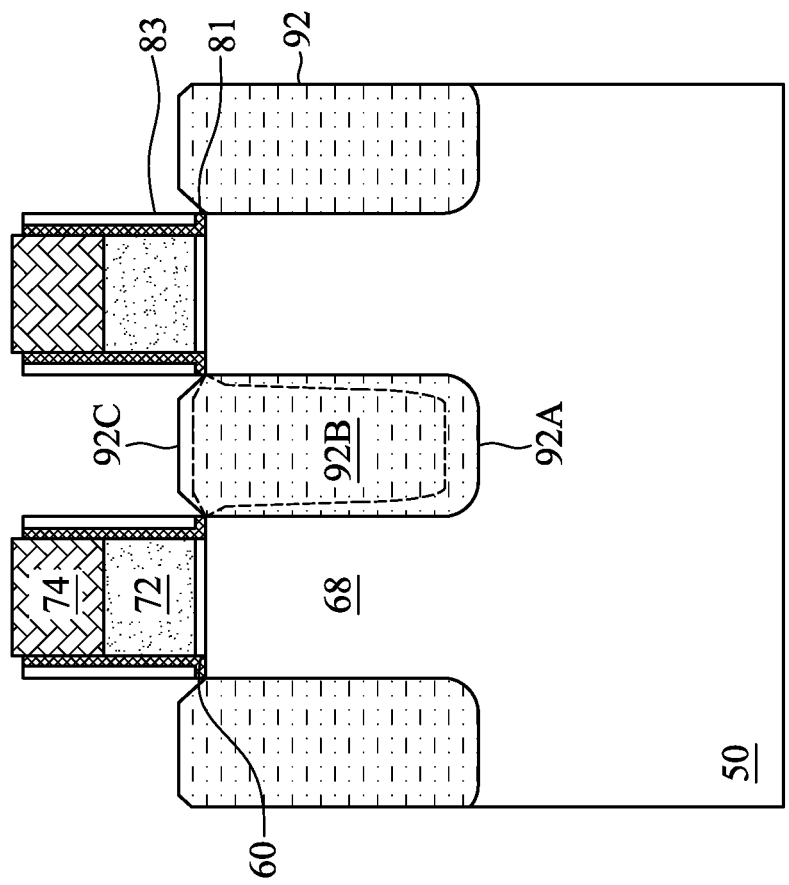
Figure 17A:
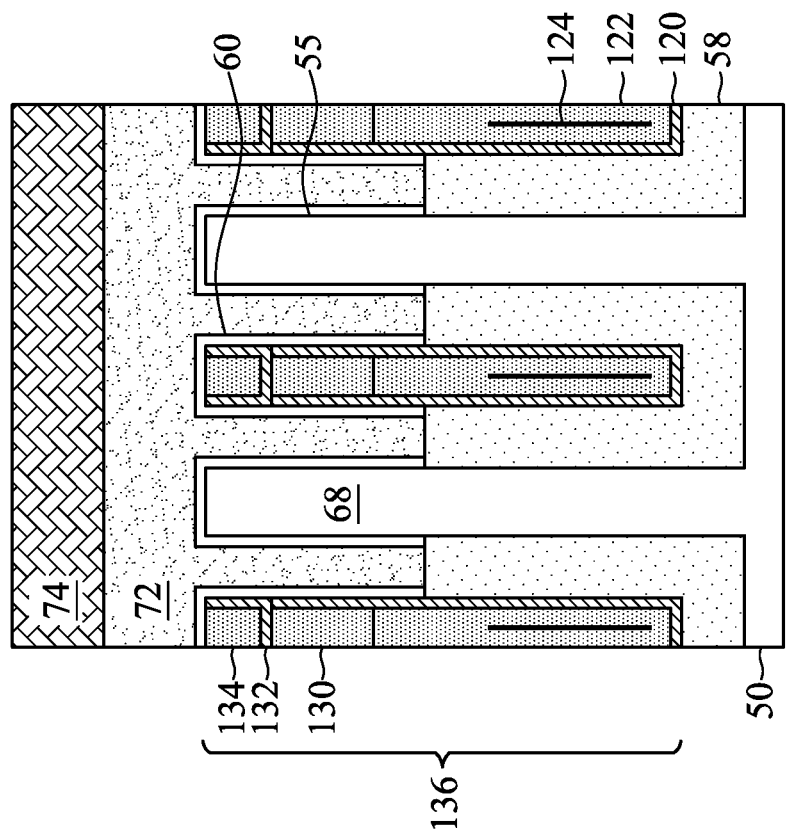
Figure 17C:
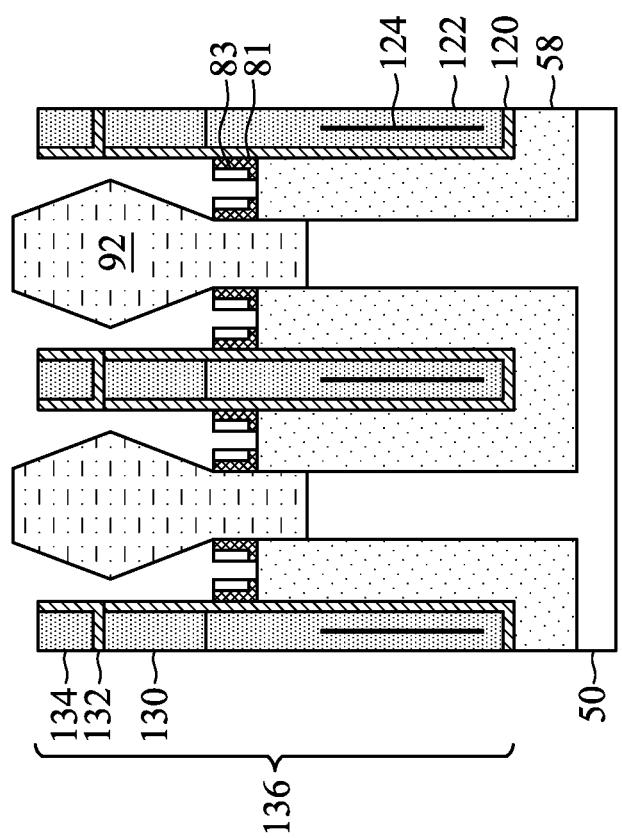

In FIGS. 17A through 17E, epitaxial source/drain regions 92 are formed in the first recesses 86 to exert stress on the channel regions 68 of the fins 55, thereby improving performance. As illustrated in FIG. 17B, the epitaxial source/ drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting FinFETs. As illustrated in FIG. 17C, the epitaxial source/drain regions 92 are formed in the first recesses 86 such that each of the epitaxial source/drain regions 92 is disposed between respective neighboring pairs of the dielectric fin structures 136. However, in the embodiments illustrated in FIGS. 17D and 17E, the epitaxial source/drain regions 92 are formed in recesses such that pairs of the epitaxial source/drain regions 92 are disposed between respective neighboring pairs of the dielectric fin structures 136.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86. The epitaxial source/drain regions 92 may include any acceptable material, such as appropriate for n-type FinFETs. For example, if the fins 55 are silicon, the epitaxial source/drain regions 92 may include materials exerting a tensile strain on the fins 55, such as silicon, silicon carbide, phosphorous doped silicon carbide, silicon phosphide, or the like. The epitaxial source/drain regions 92 may have surfaces raised from respective surfaces of the fins 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86. The epitaxial source/drain regions 92 may include any acceptable material, such as appropriate for p-type FinFETs. For example, if the fins 55 are silicon, the epitaxial source/drain regions 92 may comprise materials exerting a compressive strain on the fins 55, such as silicon-germanium, boron doped silicon-germanium, germanium, germanium tin, or the like. The epitaxial source/drain regions 92 may also have surfaces raised from respective surfaces of the fins 55 and may have facets.

The epitaxial source/drain regions 92, the fins 55, and/or the substrate 50 may be implanted with dopants to form source/drain regions, similar to the process previously discussed for forming lightly-doped source/drain regions, followed by an anneal. The epitaxial source/drain regions 92 may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 17D:
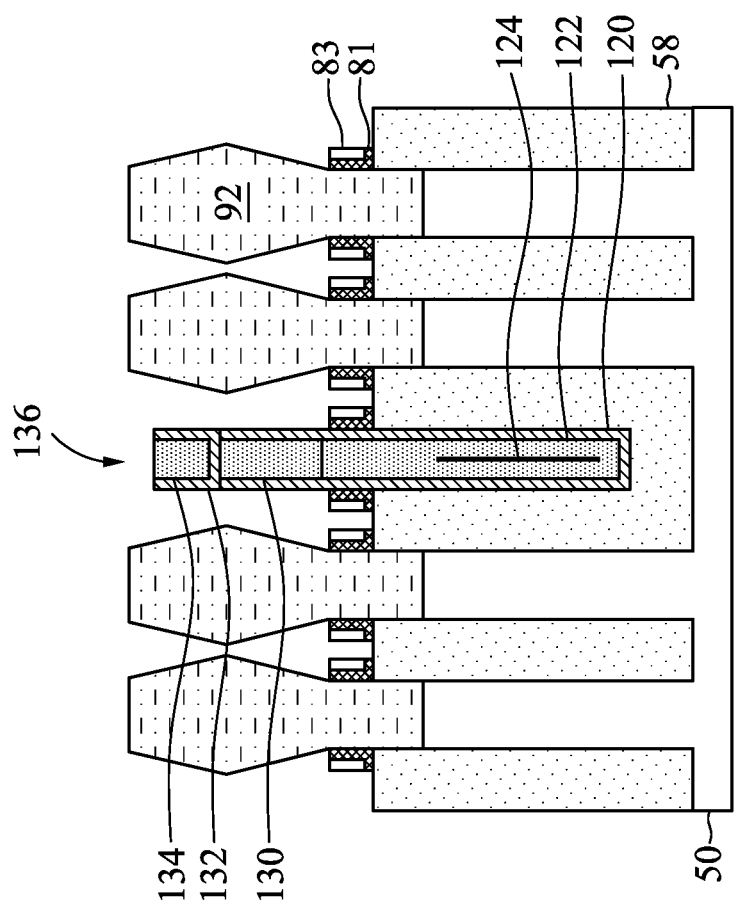
Figure 17E:
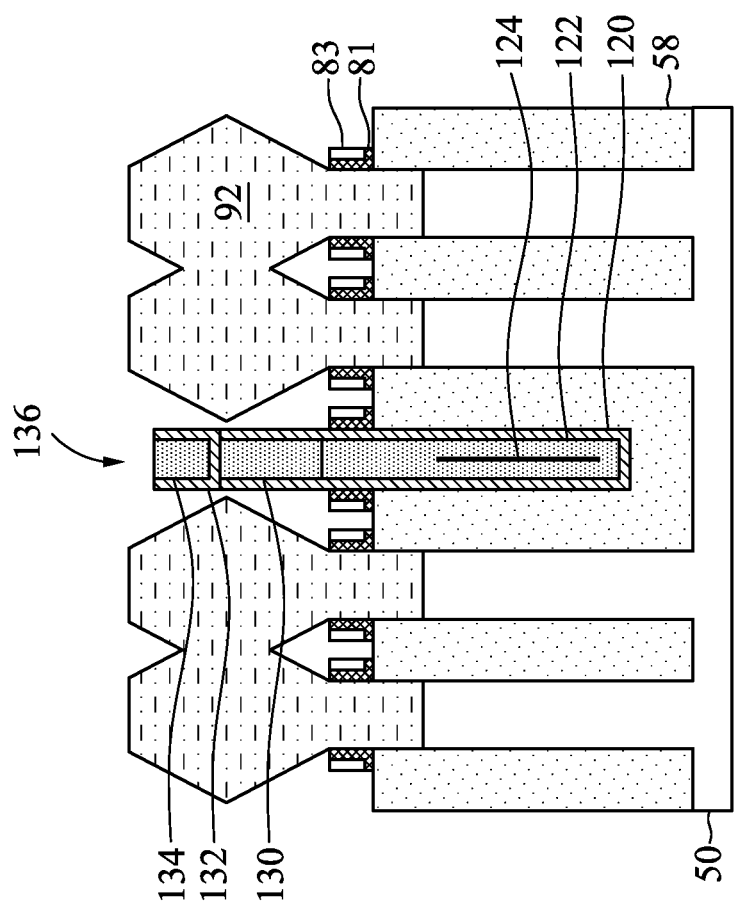

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge as illustrated by FIG. 17E. In some embodiments, adjacent epitaxial source/drain regions 92 remain separated after the epitaxy process is completed as illustrated by FIG. 17D. In the embodiments illustrated in FIGS. 17C through 17E, the first spacers 81 may be formed covering portions of the sidewalls of the fins 55 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and/or may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

In FIGS. 18A and 18B, a first interlayer dielectric (ILD) 96 is deposited over the structures illustrated in FIGS. 17A and 17B, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. In some embodiments, the dielectric materials for the first ILD 96 may include silicon oxide, silicon nitride, silicon oxynitride, or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96. In some embodiments, the first ILD 96 may be formed of silicon oxide or silicon nitride and the CESL 94 may be formed of silicon oxide or silicon nitride.

Figure 19B:
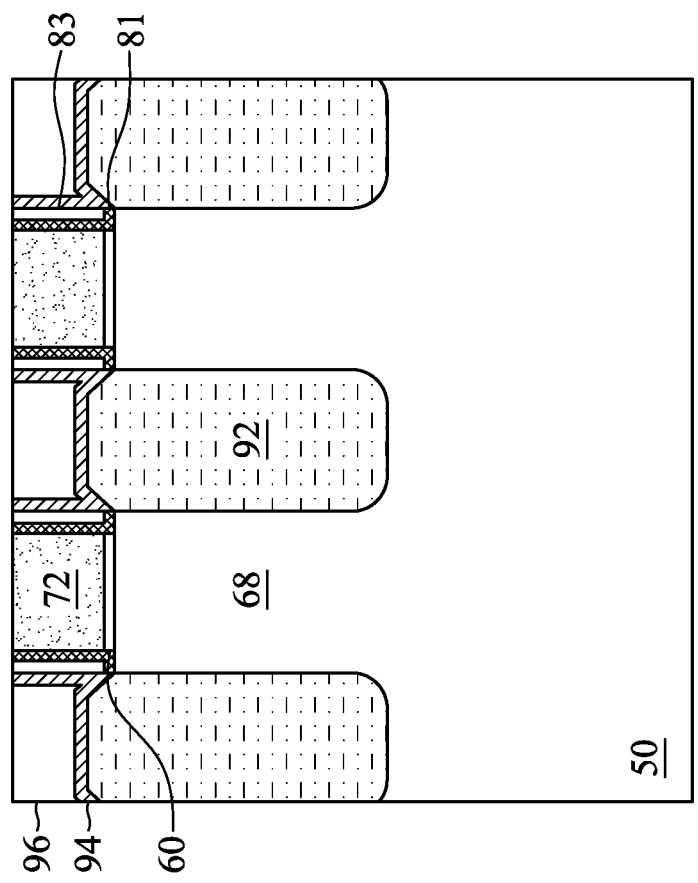
Figure 19A:
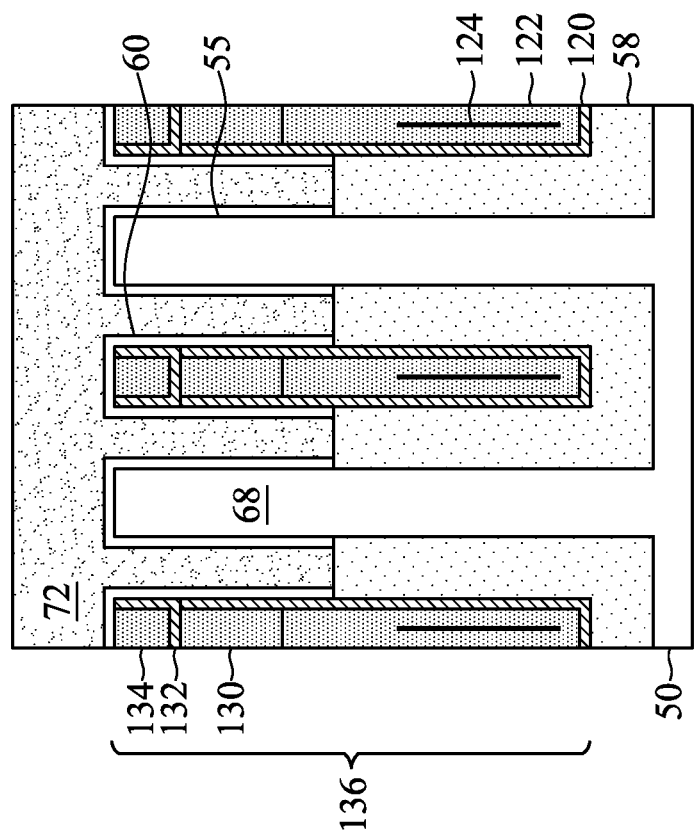

In FIGS. 19A and 19B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figures 20A, 20B:
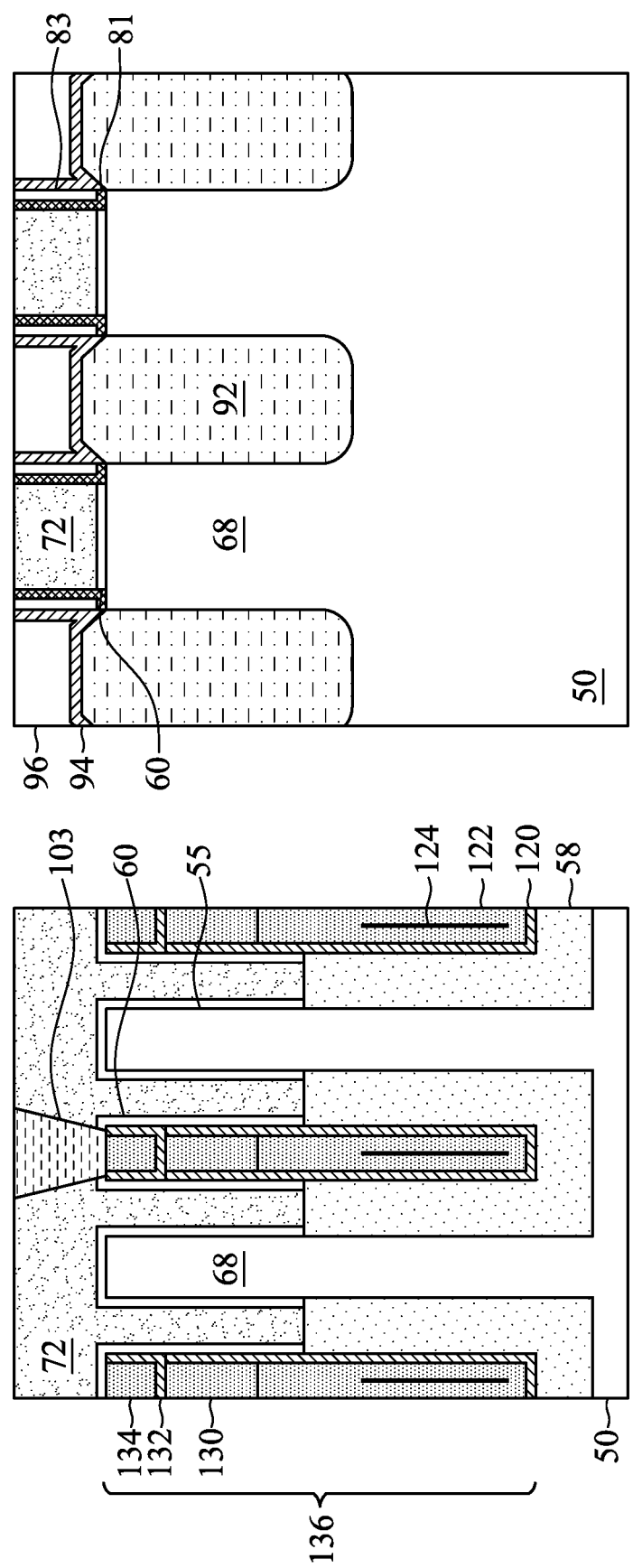

In FIGS. 20A and 20B, a gate isolation structure 103 is formed extending through the dummy gates 72 and the dummy dielectric layers 60. The dummy gates 72 and the dummy dielectric layers 60 may be etched to form an opening (not separately illustrated) exposing one of the dielectric fin structures 136. The dummy gates 72 and the dummy dielectric layers 60 may be etched using anisotropic etching processes, such as RIE, NBE, or the like. The gate isolation structure 103 is formed in the opening over the dielectric fin structure 136. The gate isolation structure 103 may fill the opening, extending along a top surface of the dielectric fin structure 136, side surfaces of the dummy gates 72 and the dummy dielectric layers 60, and top surfaces of the dummy gates 72, the first ILD 96, the CESL 94, the first spacers 81, and the second spacers 83. The gate isolation structure 103 may be used to isolate portions of the dummy gates 72, which are subsequently replaced by gate electrodes (such as the gate electrodes 102, discussed below with respect to FIGS. 22A through 22C).

In some embodiments, the material of the gate isolation structure 103 may be deposited using a conformal deposition process, such as CVD, ALD, or the like. The gate isolation structure 103 may be formed of a dielectric material, such as silicon dioxide ($SiO_2$), silicon oxynitride (SiON), combinations or multiple layers thereof, or the like. After the gate isolation structure 103 is deposited, a planarization process such as a chemical mechanical polish (CMP), an etch-back process, combinations thereof, or the like may be utilized. The planarization process exposes the dummy gates 72, the first ILD 96, the CESL 94, the first spacers 81, and the second spacers 83. After the planarization process is complete, a top surface of the gate isolation structure 103 is level with top surfaces of the dummy gates 72, the first ILD 96, the CESL 94, the first spacers 81, and the second spacers 83.

Figures 21A, 21B:
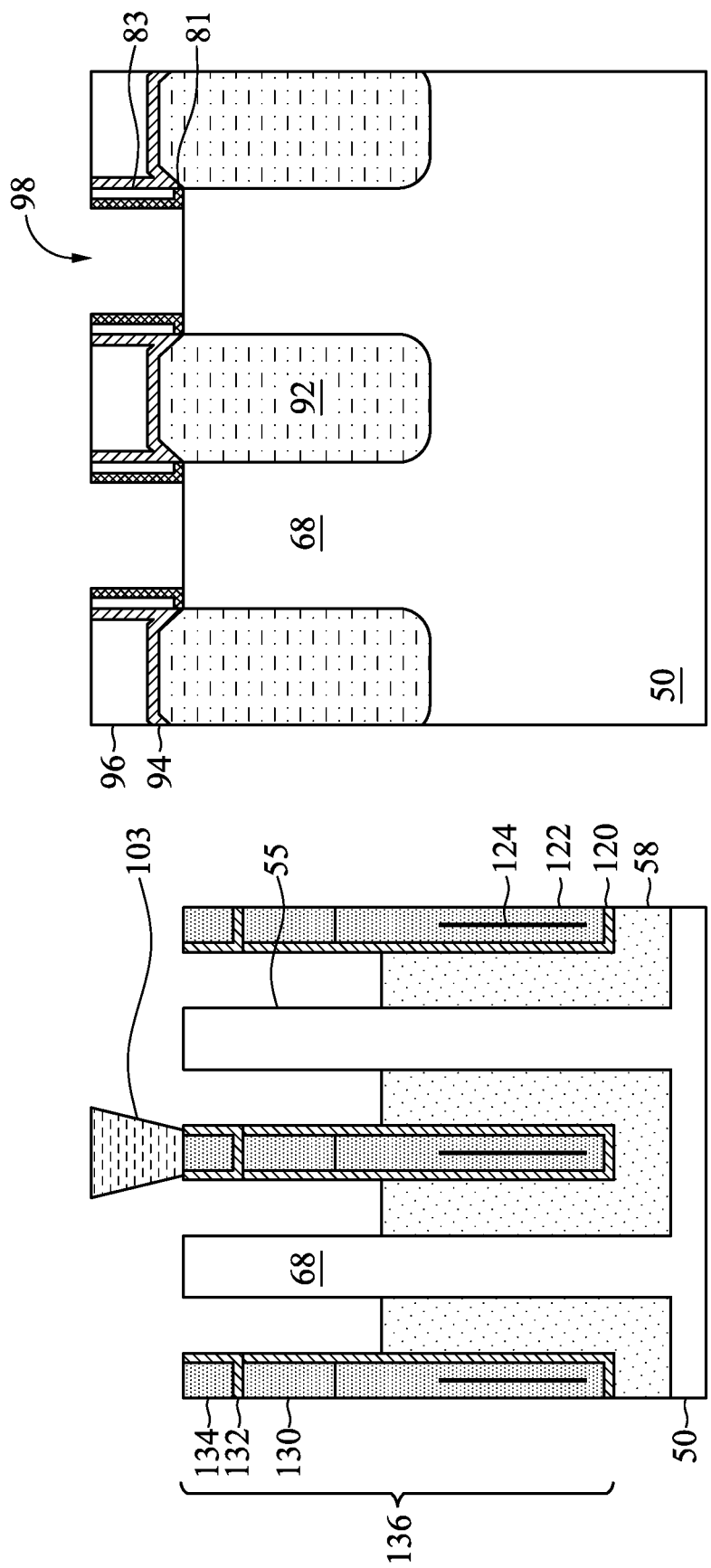

In FIGS. 21A and 21B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the gate isolation structure 103, the first ILD 96, the CESL 94, the first spacers 81, the second spacers 83, the fins 55, the dielectric fin structures 136, or the STI regions 58. Each of the second recesses 98 exposes and/or overlies a channel region 68 of a respective fin 55. Each of the channel regions 68 is disposed between neighboring pairs of the epitaxial source/drain regions 92. The channel regions 68 may further be disposed between neighboring pairs of the dielectric fin structures 136 in a cross-section perpendicular to the cross-section in which the channel regions 68 are disposed between the neighboring pairs of the epitaxial source/drain regions 92. During the removal, the dummy dielectric layer 60 may be used as an etch stop layer when the dummy gates 72 are etched. The dummy dielectric layer 60 may be optionally removed after removing the dummy gates 72.

Figures 22A, 22B:
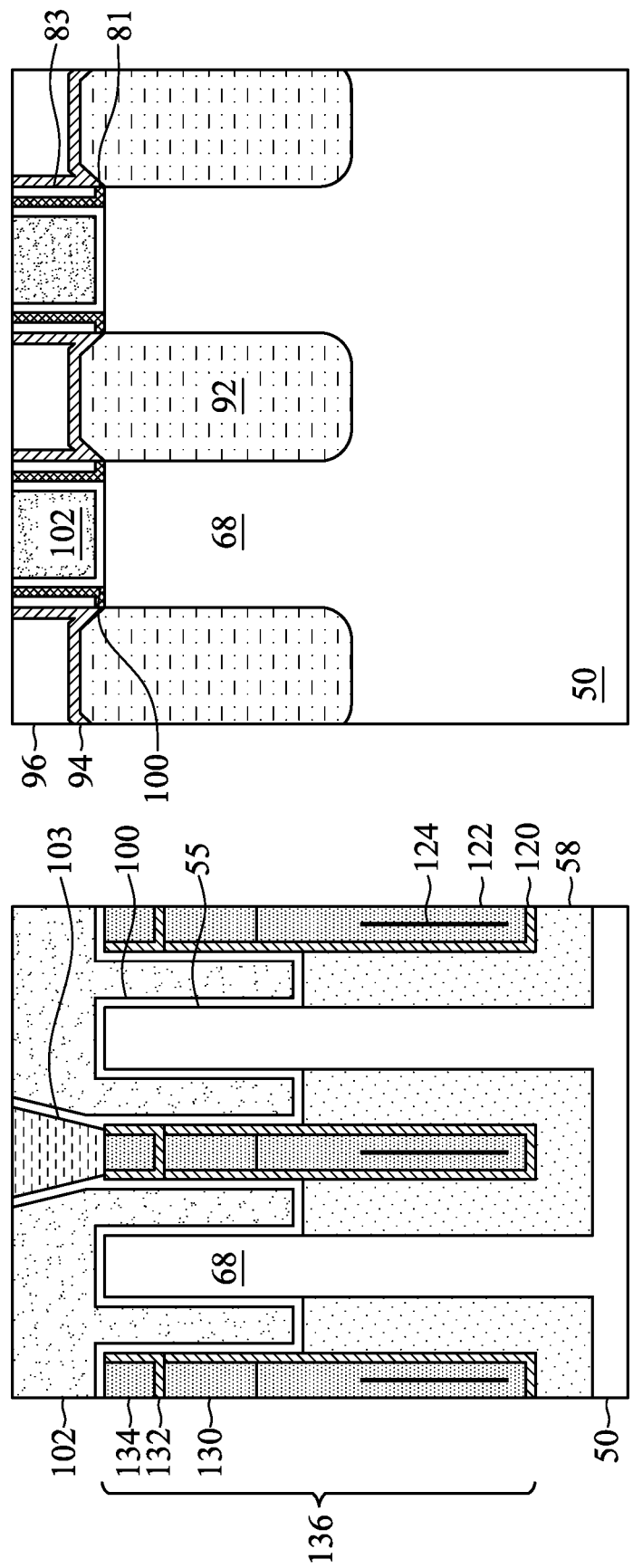
Figure 22C:
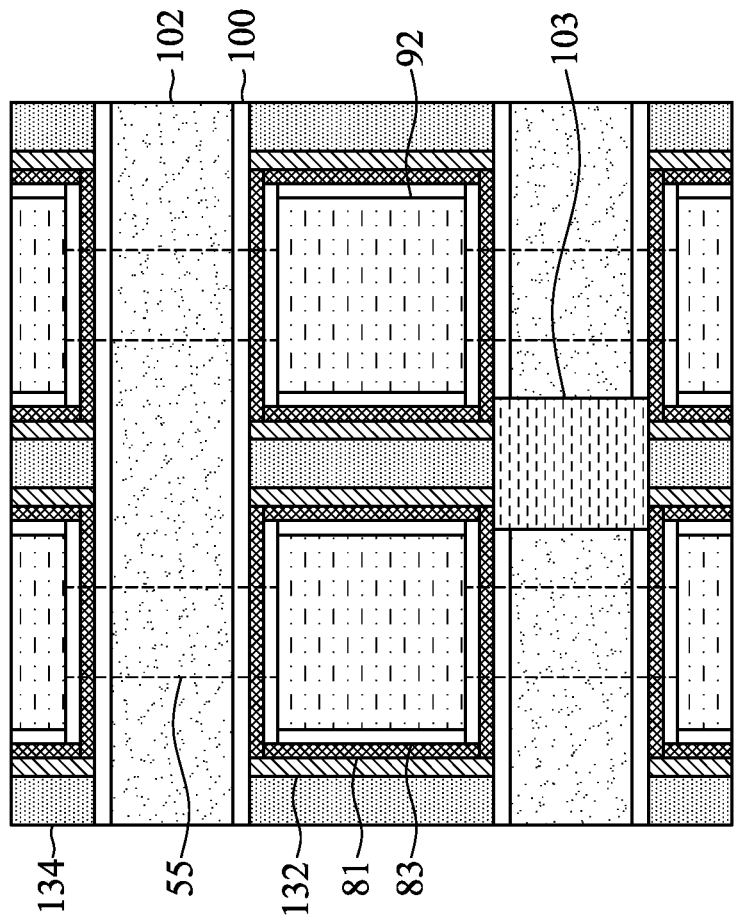

In FIGS. 22A through 22C, gate dielectric layers 100 and gate electrodes 102 are formed for replacement gates. The gate dielectric layers 100 may be formed by depositing one or more layers in the second recesses 98, such as on top surfaces and sidewalls of the fins 55, the dielectric fin structures 136, the first spacers 81, and the gate isolation structure 103, and on top surfaces of the STI regions 58, the first ILD 96, the CESL 94, and the second spacers 83. The gate dielectric layers 100 may comprise one or more layers of silicon oxide, silicon nitride, metal oxides, metal silicates, or the like. For example, in some embodiments, the gate dielectric layers 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, a combination thereof, or the like. The gate dielectric layers 100 may include dielectric layers having k-value greater than about 7.0. The gate dielectric layers 100 may be deposited by molecular-beam deposition (MBD), ALD, PECVD, or the like. In embodiments where portions of the dummy dielectric layers 60 remain in the second recesses 98, the gate dielectric layers 100 may include a material of the dummy dielectric layers 60 (e.g., $SiO_2$).

The gate electrodes 102 are deposited over the gate dielectric layers 100 and fill remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIGS. 22A through 22C, the gate electrodes 102 may comprise any number of liner layers, any number of work function tuning layers, and a fill material (not separately illustrated). After the filling of the second recesses 98, a planarization process, such as a CMP, is performed to remove excess portions of the gate dielectric layers 100 and the gate electrodes 102, which excess portions are over top surfaces of the gate isolation structure 103, the first ILD 96, the CESL 94, the first spacers 81, and the second spacers 83. The remaining portions of the gate electrodes 102 and the gate dielectric layers 100 form replacement gates of the resulting FinFETs. The gate electrodes 102 and the gate dielectric layers 100 may be collectively referred to as "gate stacks." The gate stacks may extend along sidewalls of the channel regions 68 of the fins 55.

The formation of the gate dielectric layers 100 in the n-type region 50N and the p-type region 50P may occur simultaneously such that the gate dielectric layers 100 in each region are formed from the same materials. The formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials. The gate electrodes 102 in each region may be formed by distinct processes, such that the gate electrodes 102 may be different materials. Various masking steps may be used to mask and expose appropriate regions when using distinct processes.

FIG. 22C illustrates a top-down view of the structure with the first ILD 96 and the CESL 94 being omitted. As illustrated in FIG. 22C, the fins 55 (shown as dashed lines) and the dielectric fin structures 136 may extend in parallel in a first direction, and the gate stacks may extend in parallel in a second direction perpendicular to the first direction. The gate isolation structure 103 may be formed in one of the illustrated gate stacks, without being formed in the other of the illustrated gate stacks. Gate isolation structures 103 may be formed at any point along the gate stacks.

In FIGS. 23A and 23B, a second ILD 106 is deposited over the first ILD 96, the CESL 94, the first spacers 81, the second spacers 83, the gate isolation structure 103, the gate dielectric layers 100, and the gate electrodes 102. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In some embodiments, the dielectric materials for the second ILD 106 may include silicon oxide, silicon nitride, silicon oxynitride, or the like. In some embodiments, before the formation of the second ILD 106, the gate stacks (including the gate dielectric layers 100 and the corresponding overlying gate electrodes 102) are recessed, so that recesses are formed directly over each of the respective gate stacks and between opposing portions of the first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96, the CESL 94, the gate isolation structure 103, the first spacers 81, and the second spacers 83. Subsequently formed gate contacts (such as the gate contacts 110, discussed below with respect to FIGS. 24A and 24B) penetrate through the gate mask 104 to contact top surfaces of the recessed gate electrodes 102.

Figures 24A, 24B:
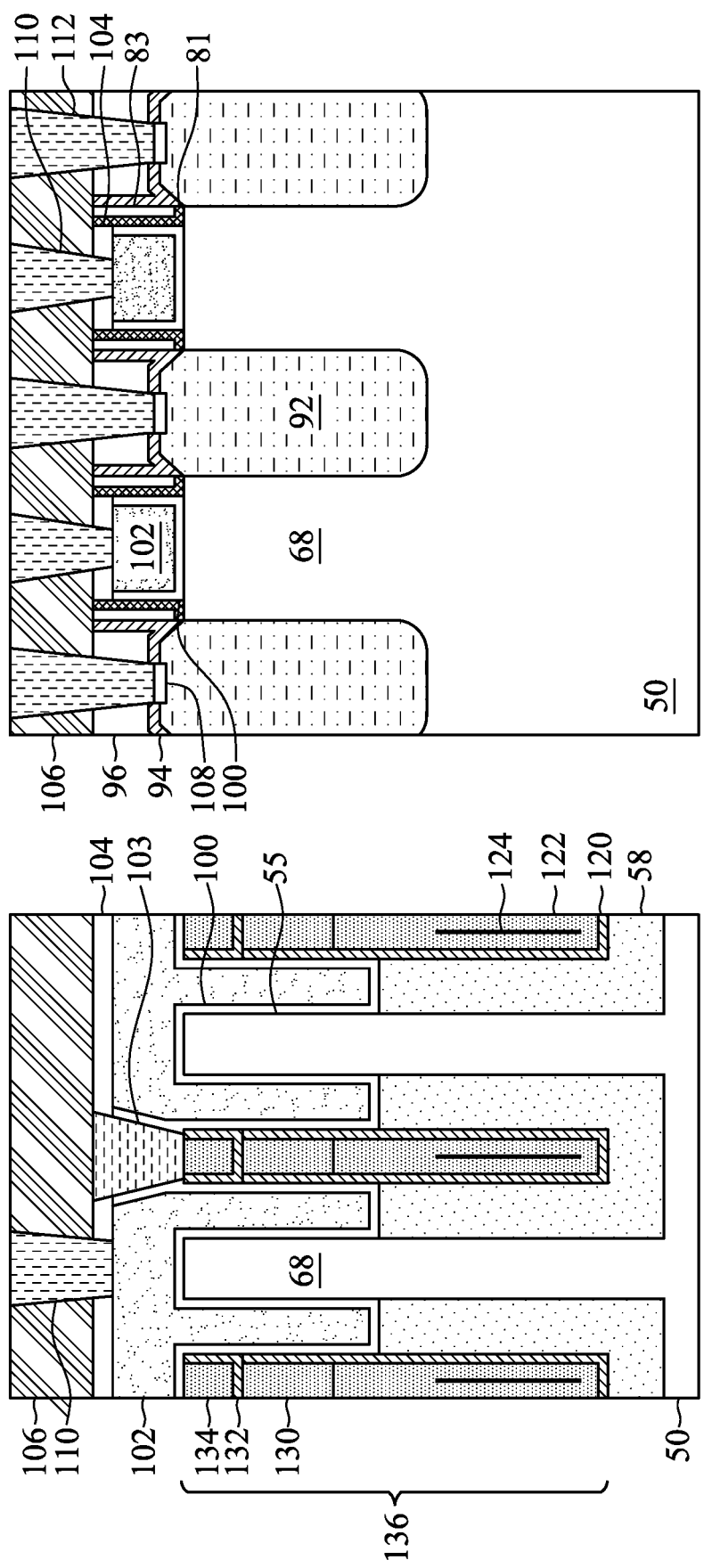
Figure 24C:
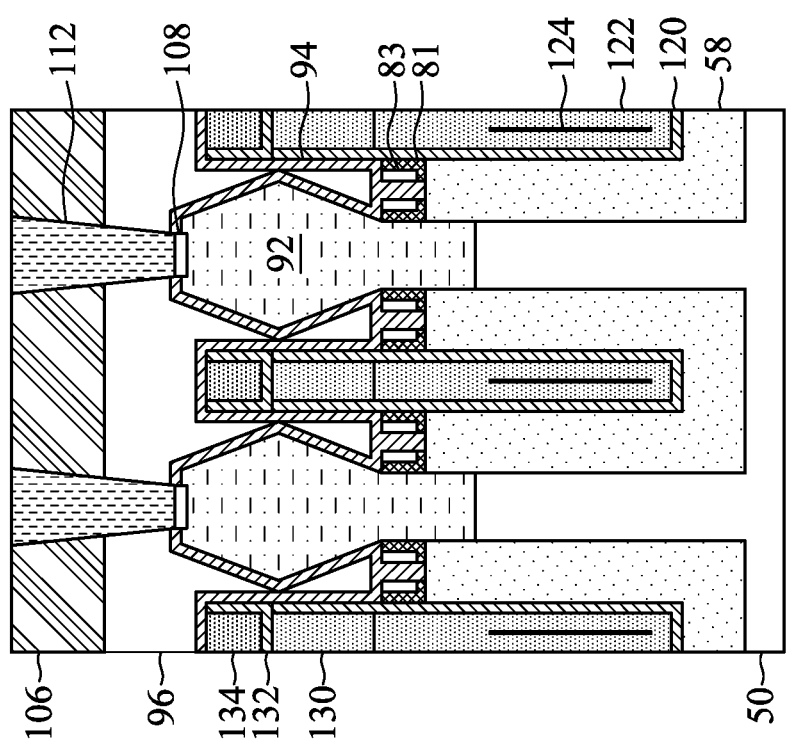

In FIGS. 24A through 24C, gate contacts 110 are formed through the second ILD 106 and the gate masks 104 and source/drain contacts 112 are formed through the second ILD 106, the first ILD 96, and the CESL 94. Openings for the source/drain contacts 112 are formed through the second ILD 106, the first ILD 96, and the CESL 94 and openings for the gate contacts 110 are formed through the second ILD 106 and the gate mask 104. The openings may be formed using acceptable photolithography and etching techniques. In some embodiments, after the openings for the source/drain contacts are formed through the second ILD 106, the first ILD 96, and the CESL 94, silicide regions 108 are formed over the epitaxial source/drain regions 92. The silicide regions 108 may be formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 108.

A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the source/drain contacts 112 and the gate contacts 110 in the openings. The source/drain contacts 112 are electrically coupled to the epitaxial source/drain regions 92 through the silicide regions 108 and the gate contacts 110 are electrically coupled to the gate electrodes 102. The source/drain contacts 112 and the gate contacts 110 may be formed in different processes, or may be formed in the same process. Although shown as being formed in the same cross-sections, it should be appreciated that each of the source/drain contacts 112 and the gate contacts 110 may be formed in different cross-sections, which may avoid shorting of the contacts.

Forming the dielectric fin structures 136 according to the above-described methods allows for the dielectric fin structures 136 to be formed without seams, or with reduced seams. This improves the etch resistance of the dielectric fin structures 136, reduces undesired etching of the dielectric fin structures 136, prevents bridging between the epitaxial source/drain regions 92, reduces cut gate failures, and reduces device defects.

Figure 25:
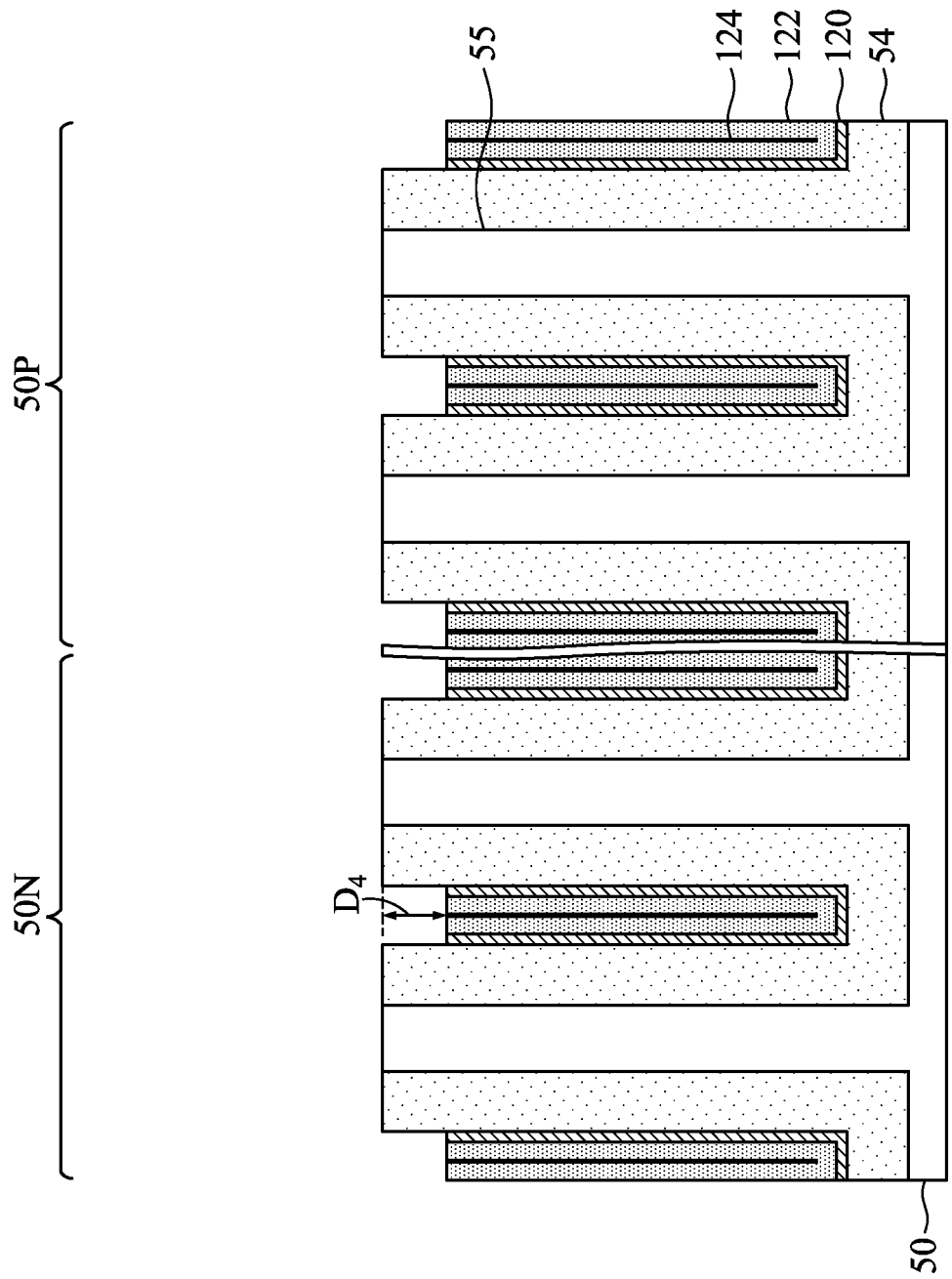

FIGS. 25 through 29C illustrate an embodiment in which a single implant process is performed while forming dielectric fin structures 146 (illustrated in FIGS. 27 through 29C), rather than two implant processes being performed to form the dielectric fin structures 136. In FIG. 25, the first liner layer 120 and the first fill material 122 of FIG. 6A are etched back. An etch-back process similar to the etch-back process discussed above with respect to FIGS. 9A and 9B may be performed on the first fill material 122 and the first liner layer 120. The first fill material 122 and the first liner layer 120 may be etched back a distance $D_4$ below top surfaces of the insulation material 54, the first liner layer 120, and the fins 55 ranging from about 5 nm to about 50 nm. The first fill material 122 and the first liner layer 120 may be etched back using an etching process that is selective to the materials of the first fill material 122 and the first liner layer 120 (e.g., etches the material of the first fill material 122 and the first liner layer 120 at faster rates than the materials of the fins 55 and the insulation material 54). In some embodiments, a dry etching process, such as a dry etching process using etchants comprising $CF_x$, $C_xF_y$, or the like, may be used. In some embodiments, a wet etching process may be used.

Figure 26:
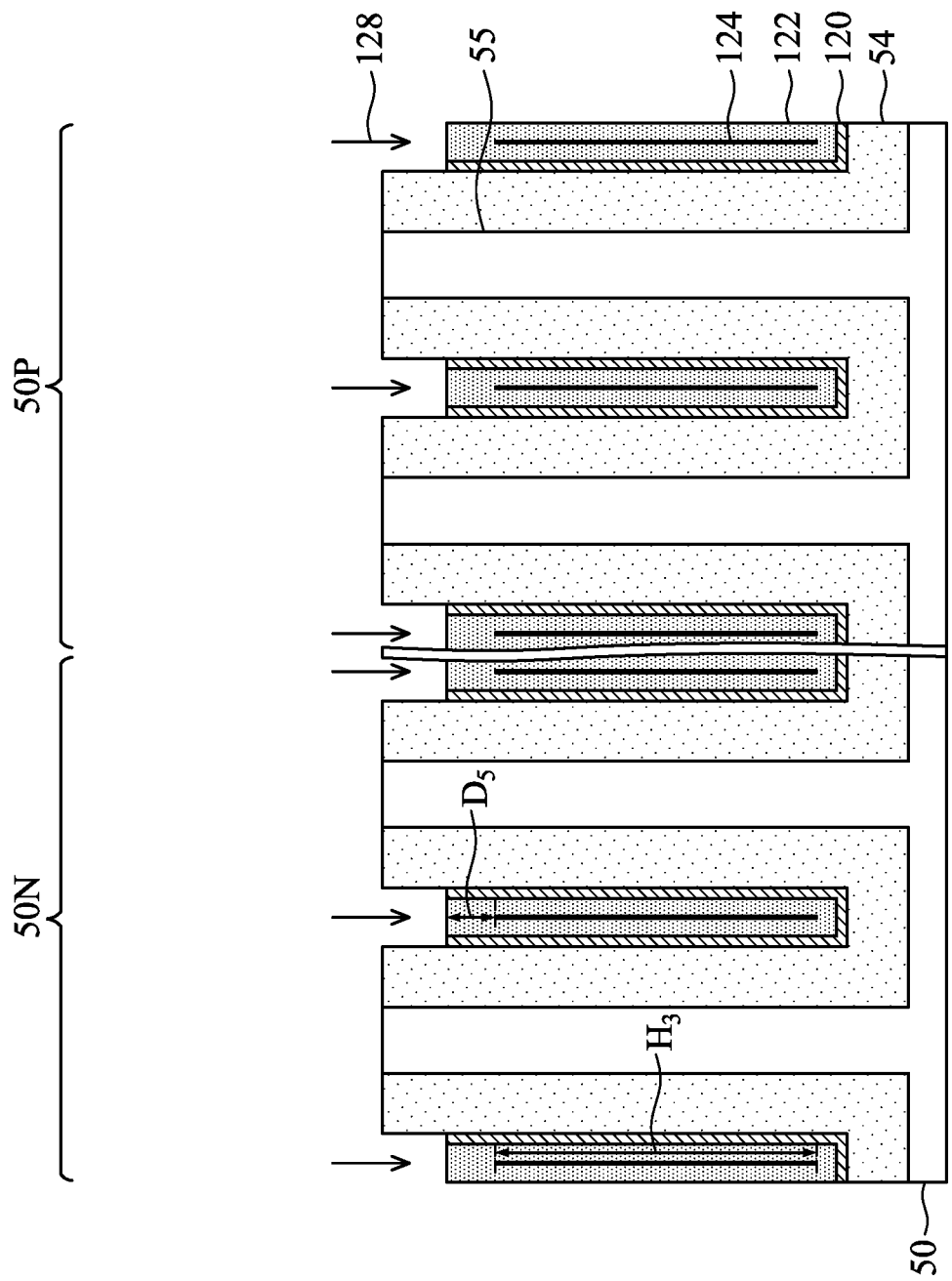

In FIG. 26, an implantation process is performed on the first fill material 122. The implantation process is performed to implant dopants 128 into the first fill material 122. In some embodiments, the dopants 128 may include nitrogen, argon, combinations thereof, or the like. The dopants 128 may be implanted to a depth $D_5$ below top surfaces of the first fill material 122 ranging from about 5 nm to about 50 nm. A dosage for the implantation process may range from about 1 atoms/cm$^2$ to about 100 atoms/cm$^2$. The implantation process may be performed at a temperature ranging from about 25° C. to about 100° C. with an applied energy ranging from about 5 keV to about 25 keV. Following the implantation process, a concentration of the dopant in the portion of the first fill material 122 exposed to the implantation process may range from about 0.1 at. % to about 5 at. %. A concentration of carbon in a portion of the first fill material 122 exposed to the implantation process may be reduced by the implantation process, and may range from about 12 at. % to about 20 at. % after the implantation process is performed. The concentration of carbon in the portion of the first fill material 122 exposed to the implantation process may be less than the concentration of carbon in the portion of the first fill material 122 that was not exposed to the implantation process. Similarly, a concentration of silicon in the portion of the first fill material 122 exposed to the implantation process may be less than the concentration of silicon in the portion of the first fill material 122 that was not exposed to the implantation process.

Performing the implantation process on the first fill material 122 causes the seam 124 to be eliminated from the portion of the first fill material 122 exposed to the implantation process. Specifically, the implantation process breaks bonds in the first fill material 122 and causes re-bonding in the first fill material 122, which eliminates the seam 124. As illustrated in FIG. 26, in some embodiments, a portion of the first fill material 122 may not be exposed to the implantation process, and the seam 124 may remain in this portion of the first fill material 122. The remaining portion of the seam 124 may have a height $H_3$ ranging from about 5 nm to about 50 nm Eliminating the seam 124 in the upper portions of the first fill material 122 improves the etch resistance of the first fill material 122. This reduces undesired etching of the first fill material 122, prevents bridging between epitaxial structures, reduces cut gate failures, and reduces device defects.

Figure 27:
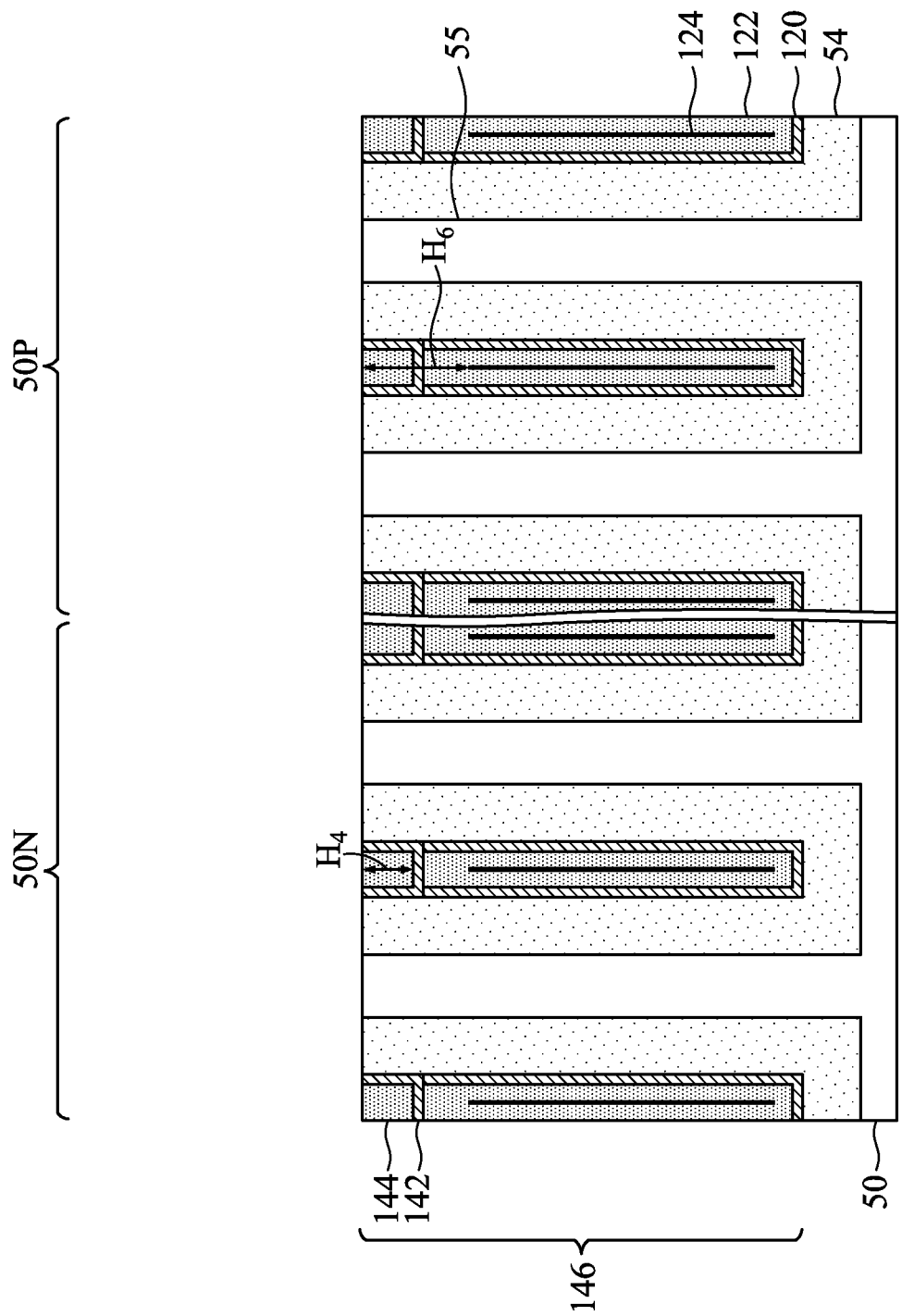

In FIG. 27, a second liner layer 142 and a second fill material 144 are formed in the openings 126 over the first fill material 122 and the first liner layer 120. The second liner layer 142 and the second fill material 144 may fill the openings 126. The second liner layer 142 may be formed of materials and by methods the same as or similar to those used to form the first liner layer 120, discussed above with respect to FIGS. 5A and 5B. The second fill material 144 may be formed of materials and by methods the same as or similar to those used to form the first fill material 122, discussed above with respect to FIGS. 5A and 5B. In some embodiments, the second liner layer 142 may be formed of silicon carbon nitride having a concentration of carbon ranging from about 2 at. % to about 10 at. % and the second fill material 144 may be formed of silicon carbon nitride having a concentration of carbon ranging from about 12 at. % to about 20 at. %. In some embodiments, the second liner layer 142 may include silicon carbonitride (SiCN), silicon nitride (SiN), silicon carbide (SiC), or the like and the second fill material 144 may include silicon carbonitride, silicon nitride, silicon carbide, or the like. After the second liner layer 142 and the second fill material 144 are deposited, a removal process the same as or similar to the removal process discussed above with respect to FIGS. 6A and 6B may be performed on the second liner layer 142 and the second fill material 144 such that top surfaces of the second liner layer 142 and the second fill material 144 are level with top surfaces of the fins 55 and the insulation material 54. The first liner layer 120, the first fill material 122, the second liner layer 152, and the second fill material 144 may be collectively referred to as dielectric fin structures 146. Each of the dielectric fin structures 146 may have a lengthwise direction parallel to lengthwise directions of the respective fins 55.

The second fill material 144 may be formed without a seam, even though the above-described implantation process may not be performed on the second fill material 144. The second fill material 144 may have a height $H_4$ ranging from about 5 nm to about 50 nm, which is sufficiently small such that a seam is not formed in the second fill material 144 when the second fill material 144 is deposited. The dielectric fin structures 146 may have seam-free heights $H_6$ above the seams 124 ranging from about 5 nm to about 50 nm. In some embodiments, the second fill material 144 may be deposited with a carbon concentration greater than carbon concentrations of the first fill material 122 and the second fill material 130. As such, the second fill material 144 may have improved etch resistance. In some embodiments, the carbon concentration in the second fill material 144 may be the same as the carbon concentration in the portion of the first fill material 122 that is not exposed to the implantation process, and greater than the carbon concentrations of the portion of the first fill material 122 that is exposed to the implantation process. In some embodiments, a silicon concentration in the second fill material 144 may be the same as a silicon concentration in the portion of the first fill material 122 that is not exposed to the implantation process and less than a silicon concentration of the portion of the first fill material 122 that is exposed to the implantation process Eliminating seams from the dielectric fin structures 146 improves the etch resistance of the dielectric fin structures 146. This reduces undesired etching of the dielectric fin structures 146, prevents bridging between epitaxial structures, reduces cut gate failures, and reduces device defects.

Figure 28:
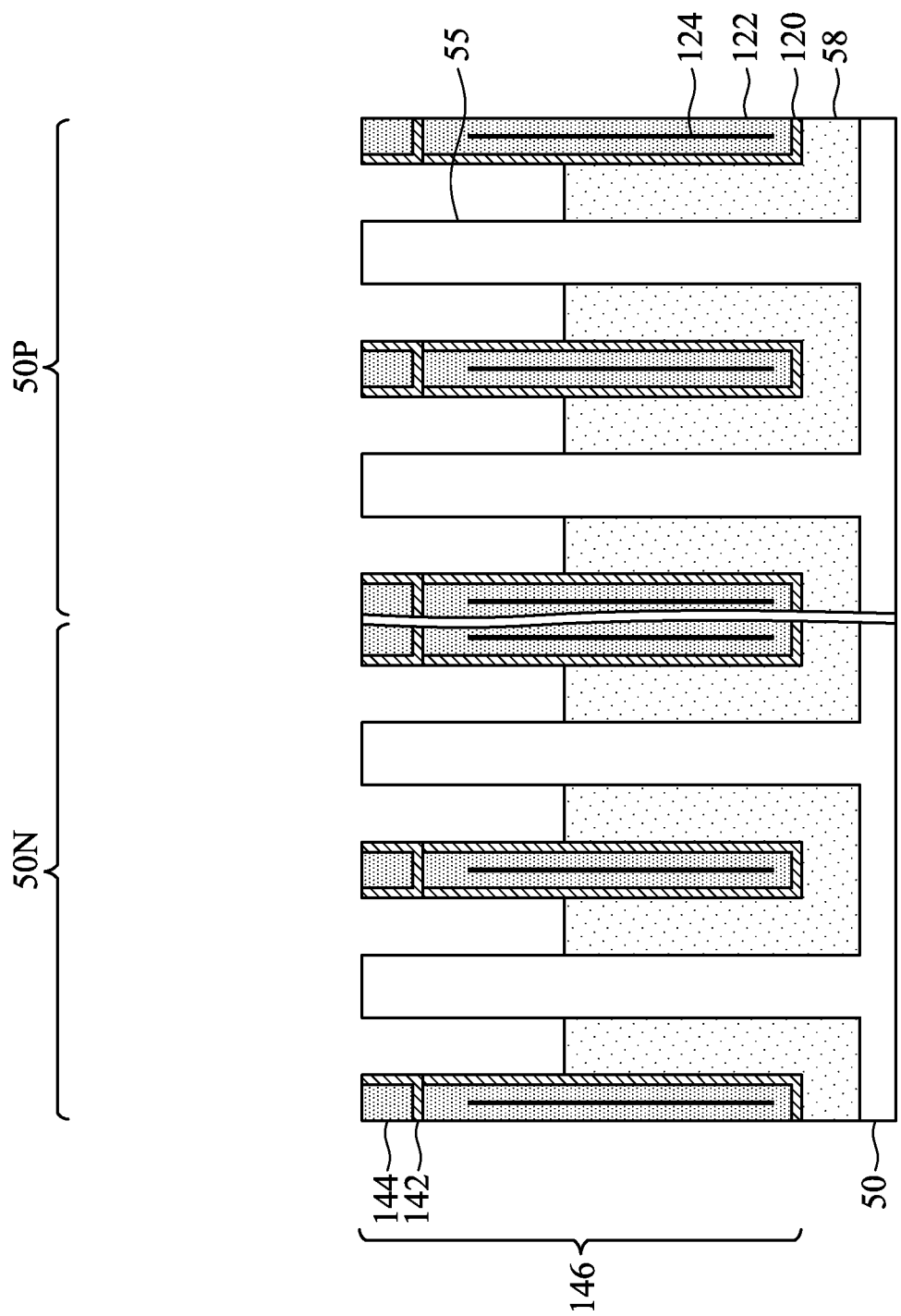

In FIG. 28, the insulation material 54 is recessed to form shallow trench isolation (STI) regions 58. The insulation material 54 is recessed such that upper portions of the fins 55 and the dielectric fin structures 146 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material 54 (e.g., etches the material of the insulation material 54 at a faster rate than the material of the fins 55 and the dielectric fin structures 146). For example, an oxide removal using, for example, dilute hydrofluoric (dHF) acid may be used.

Figures 29A, 29B:
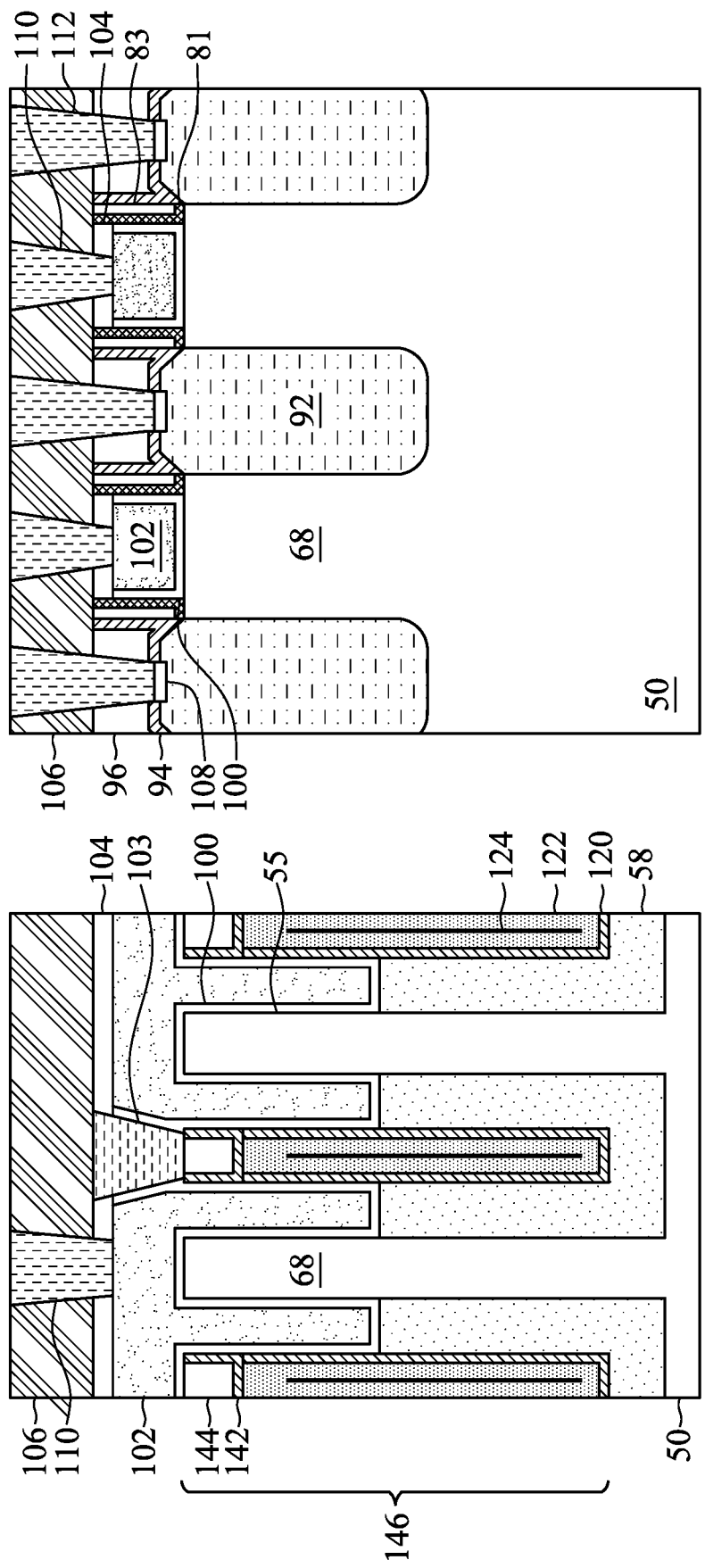
Figure 29C:
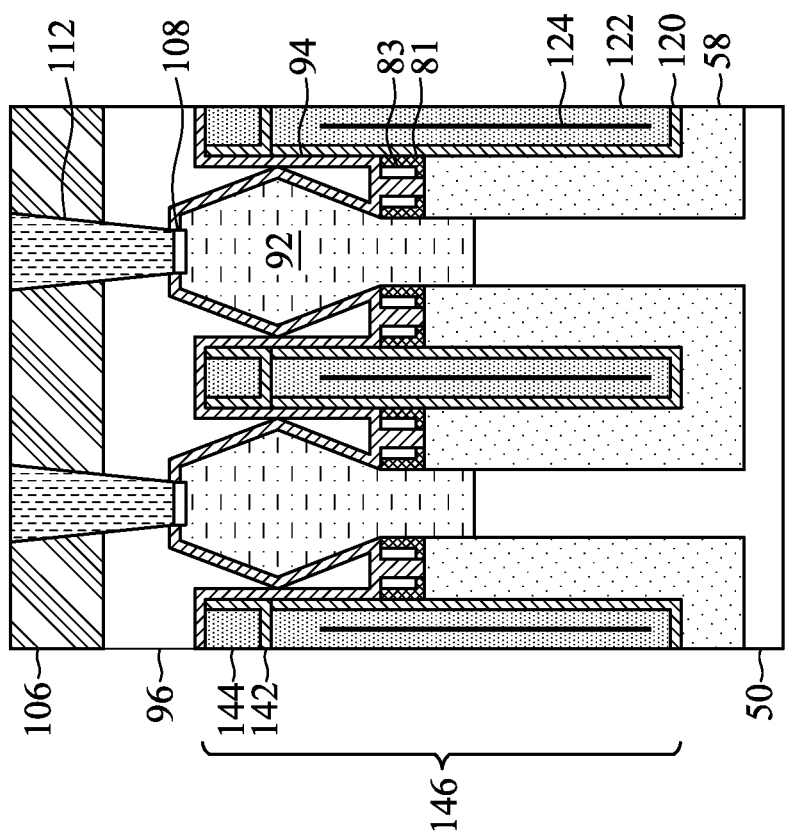

In FIGS. 29A through 29C, processes similar to or the same as those discussed above with respect to FIGS. 12 through 24C are performed. Forming the dielectric fin structures 146 according to the above-described methods allows for the dielectric fin structures 146 to be formed without seams, or with reduced seams. This improves the etch resistance of the dielectric fin structures 146, reduces undesired etching of the dielectric fin structures 146, prevents bridging between the epitaxial source/drain regions 92, reduces cut gate failures, and reduces device defects. Moreover, the dielectric fin structures 146 may be formed with a reduced number of steps as compared to the dielectric fin structures 136, which reduces production costs.

Figures 30A, 30B:
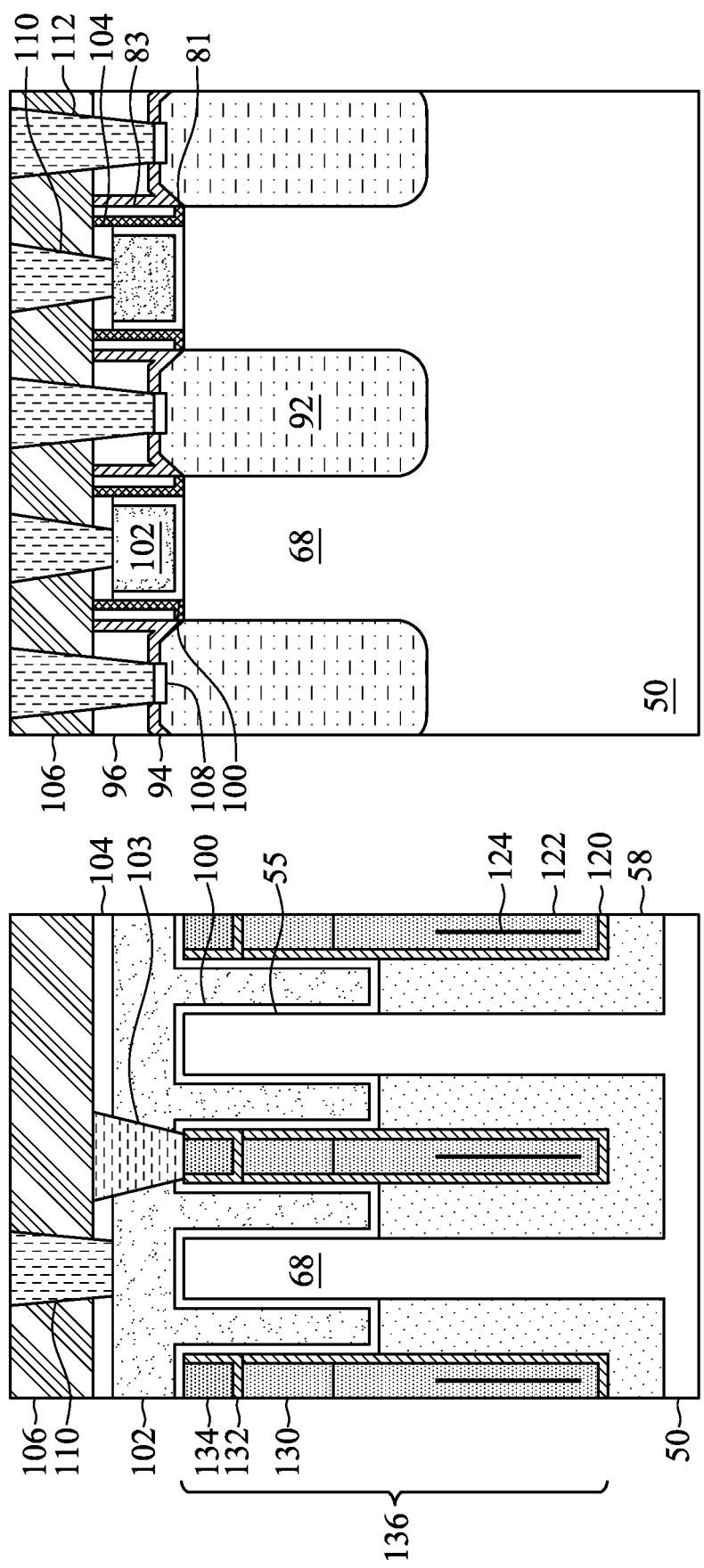
Figure 30C:
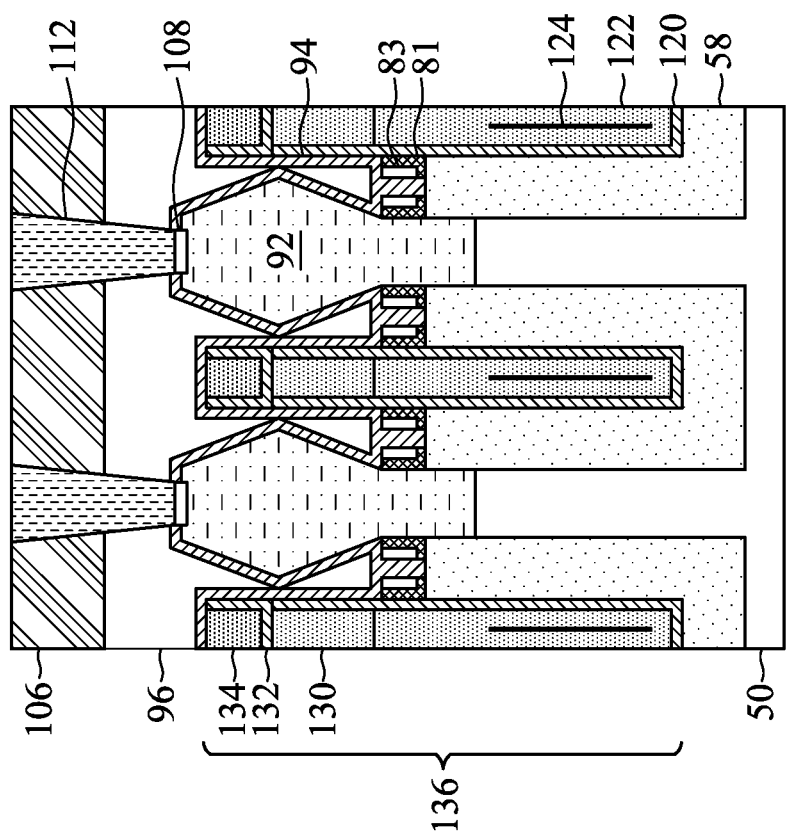

FIGS. 30A through 30C illustrate an embodiment in which the gate isolation structure 103 is formed after forming the replacement gates (e.g., including the gate dielectric layers 100 and the gate electrodes 102), rather than being formed before removing the dummy gate stacks (e.g., including the dummy dielectric layers 60 and the dummy gates 72. As illustrated in FIGS. 30A through 30C, the final structures are similar to the structures illustrated in FIGS. 24A through 24C, except that the gate dielectric layers 100 do not extend along sidewalls of the gate isolation structure 103.

Embodiments achieve various advantages. For example, forming the dielectric fin structures according to the above-described methods allows for the dielectric fin structures to be formed without seams, or with reduced seams. This improves the etch resistance of the dielectric fin structures, reduces undesired etching of the dielectric fin structures, prevents bridging between epitaxial structures, reduces cut gate failures, and reduces device defects.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

In accordance with an embodiment, a semiconductor device includes a fin extending from a semiconductor substrate; a shallow trench isolation (STI) region over the semiconductor substrate adjacent the fin; and a dielectric fin structure over the STI region, the dielectric fin structure extending in a direction parallel to the fin, the dielectric fin structure including a first liner layer in contact with the STI region; and a first fill material over the first liner layer, the first fill material including a seam disposed in a lower portion of the first fill material and separated from a top surface of the first fill material, a first carbon concentration in the lower portion of the first fill material being greater than a second carbon concentration in an upper portion of the first fill material. In an embodiment, the first liner layer has a third carbon concentration less than 10 at. %. In an embodiment, the first carbon concentration and the second carbon concentration of the first fill material are greater than 12 at. %. In an embodiment, the semiconductor device further includes a second fill material over the first fill material and the first liner layer, the second fill material contacting the first liner layer and the first fill material, and an interface between the second fill material and the first fill material being V-shaped. In an embodiment, the first liner layer and the first fill material include silicon carbon nitride, and the first carbon concentration and the second carbon concentration of the first fill material are greater than a third carbon concentration of the first liner layer. In an embodiment, the dielectric fin structure further includes a second liner layer over and in contact with the first liner layer and the first fill material; and a second fill material over the second liner layer. In an embodiment, a third carbon concentration in the second fill material is equal to the first carbon concentration in the first fill material. In an embodiment, a third carbon concentration in the second fill material is greater than both the first carbon concentration and the second carbon concentration in the first fill material.

In accordance with another embodiment, a semiconductor device includes a channel region over a semiconductor substrate; a shallow trench isolation (STI) region over the semiconductor substrate adjacent the channel region; and a dielectric fin structure over the STI region, the dielectric fin structure extending in a direction parallel to the channel region, the dielectric fin structure having a top surface level with a top surface of the channel region, the dielectric fin structure including a first liner layer in contact with the STI region; a first fill material over the first liner layer, the first fill material including a seam disposed in a lower portion of the first fill material and separated from a top surface of the first fill material; a second liner layer over the first liner layer and the first fill material; and a second fill material over the second liner layer, the second fill material including a seam-free material. In an embodiment, the semiconductor device further includes a third fill material over the first fill material, the second liner layer contacting the first liner layer and the third fill material, the third fill material including a seam-free material. In an embodiment, a first carbon concentration in the lower portion of the first fill material is greater than a second carbon concentration in an upper portion of the first fill material, a third carbon concentration in the third fill material is equal to the second carbon concentration, and a fourth carbon concentration in the second fill material is equal to the first carbon concentration. In an embodiment, the second liner layer contacts the first liner layer and the first fill material, a first carbon concentration in the lower portion of the first fill material is greater than a second carbon concentration in an upper portion of the first fill material, and a third carbon concentration in the second fill material is equal to the first carbon concentration. In an embodiment, the first liner layer and the second liner layer include silicon carbon nitride having a first carbon concentration less than 10 at. %, and the first fill material and the second fill material include silicon carbon nitride having a second carbon concentration greater than 12 at. %.

In accordance with yet another embodiment, a method includes forming a semiconductor fin extending from a substrate; depositing an isolation material over the semiconductor fin and the substrate; depositing a dielectric liner over the isolation material; depositing a dielectric fill material over the dielectric liner, the dielectric fill material including a seam; and performing an implantation process on the dielectric fill material, the implantation process removing the seam adjacent a top surface of the dielectric fill material. In an embodiment, performing the implantation process includes implanting nitrogen into the dielectric fill material. In an embodiment, performing the implantation process includes implanting argon into the dielectric fill material. In an embodiment, the method further includes planarizing the isolation material, the dielectric liner, and the dielectric fill material; and etching back the dielectric fill material to form a first recess over the dielectric fill material and between opposite sidewalls of the dielectric liner, the dielectric fill material being etched back before performing the implantation process. In an embodiment, the method further includes depositing a second dielectric fill material over the dielectric fill material; and performing a second implantation process on the second dielectric fill material, the second implantation process removing a seam from the second dielectric fill material. In an embodiment, the method further includes planarizing the isolation material, the dielectric liner, and the second dielectric fill material; etching back the second dielectric fill material and the dielectric liner to form a second recess over the second dielectric fill material and between opposite sidewalls of the dielectric liner; depositing a second dielectric liner in the first recess; and depositing a third dielectric fill material over the second dielectric liner. In an embodiment, the method further includes planarizing the isolation material, the dielectric liner, and the dielectric fill material; etching back the dielectric fill material and the dielectric liner to form a first recess over the dielectric fill material and between opposite sidewalls of the dielectric liner; depositing a second dielectric liner in the first recess; and depositing a second dielectric fill material over the second dielectric liner, the second dielectric fill material being a seamless material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a fin extending from a semiconductor substrate;
    a shallow trench isolation (STI) region over the semiconductor substrate adjacent the fin; and
    a dielectric fin structure over the STI region, the dielectric fin structure extending in a direction parallel to the fin, the dielectric fin structure comprising:
        a first liner layer in contact with the STI region; and
        a first fill material over the first liner layer, the first fill material comprising a seam disposed in a lower portion of the first fill material and separated from a top surface of the first fill material, wherein a first carbon concentration in the lower portion of the first fill material is greater than a second carbon concentration in an upper portion of the first fill material.

2. The semiconductor device of claim 1, wherein the first liner layer has a third carbon concentration less than 10 at. %.

3. The semiconductor device of claim 2, wherein the first carbon concentration and the second carbon concentration of the first fill material are greater than 12 at. %.

4. The semiconductor device of claim 1, further comprising a second fill material over the first fill material and the first liner layer, wherein the second fill material contacts the first liner layer and the first fill material, and wherein an interface between the second fill material and the first fill material is V-shaped.

5. The semiconductor device of claim 1, wherein the first liner layer and the first fill material comprise silicon carbon nitride, and wherein the first carbon concentration and the second carbon concentration of the first fill material are greater than a third carbon concentration of the first liner layer.

6. The semiconductor device of claim 1, wherein the dielectric fin structure further comprises:
    a second liner layer over and in contact with the first liner layer and the first fill material; and
    a second fill material over the second liner layer.

7. The semiconductor device of claim 6, wherein a third carbon concentration in the second fill material is equal to the first carbon concentration in the first fill material.

8. The semiconductor device of claim 6, wherein a third carbon concentration in the second fill material is greater than both the first carbon concentration and the second carbon concentration in the first fill material.

9. A semiconductor device comprising:
    a channel region over a semiconductor substrate;
    a shallow trench isolation (STI) region over the semiconductor substrate adjacent the channel region; and
    a dielectric fin structure over the STI region, the dielectric fin structure extending in a direction parallel to the channel region, the dielectric fin structure having a top surface level with a top surface of the channel region, the dielectric fin structure comprising:
        a first liner layer in contact with the STI region;
        a first fill material over the first liner layer, the first fill material comprising a seam disposed in a lower portion of the first fill material and separated from a top surface of the first fill material;
        a second liner layer over the first liner layer and the first fill material; and
        a second fill material over the second liner layer, wherein the second fill material comprises a seam-free material.

10. The semiconductor device of claim 9, further comprising a third fill material over the first fill material, wherein the second liner layer contacts the first liner layer and the third fill material, wherein the third fill material comprises a seam-free material.

11. The semiconductor device of claim 10, wherein a first carbon concentration in the lower portion of the first fill material is greater than a second carbon concentration in an upper portion of the first fill material, wherein a third carbon concentration in the third fill material is equal to the second carbon concentration, and wherein a fourth carbon concentration in the second fill material is equal to the first carbon concentration.

12. The semiconductor device of claim 9, wherein the second liner layer contacts the first liner layer and the first fill material, wherein a first carbon concentration in the lower portion of the first fill material is greater than a second carbon concentration in an upper portion of the first fill material, and wherein a third carbon concentration in the second fill material is equal to the first carbon concentration.

13. The semiconductor device of claim 9, wherein the first liner layer and the second liner layer comprise silicon carbon nitride having a first carbon concentration less than 10 at. %, and wherein the first fill material and the second fill material comprise silicon carbon nitride having a second carbon concentration greater than 12 at. %.

14. A method comprising:
forming a semiconductor fin extending from a substrate;
depositing an isolation material over the semiconductor fin and the substrate;
depositing a dielectric liner over the isolation material;
depositing a dielectric fill material over the dielectric liner, the dielectric fill material comprising a seam; and
performing an implantation process on the dielectric fill material, wherein the implantation process removes the seam adjacent to a top surface of the dielectric fill material.

15. The method of claim 14, wherein performing the implantation process comprises implanting nitrogen into the dielectric fill material.

16. The method of claim 14, wherein performing the implantation process comprises implanting argon into the dielectric fill material.

17. The method of claim 14, further comprising:
planarizing the isolation material, the dielectric liner, and the dielectric fill material; and
etching back the dielectric fill material to form a first recess over the dielectric fill material and between opposite sidewalls of the dielectric liner, wherein the dielectric fill material is etched back before performing the implantation process.

18. The method of claim 17, further comprising:
depositing a second dielectric fill material over the dielectric fill material; and
performing a second implantation process on the second dielectric fill material, wherein the second implantation process removes a seam from the second dielectric fill material.

19. The method of claim 18, further comprising:
planarizing the isolation material, the dielectric liner, and the second dielectric fill material;
etching back the second dielectric fill material and the dielectric liner to form a second recess over the second dielectric fill material and between opposite sidewalls of the dielectric liner;
depositing a second dielectric liner in the first recess; and
depositing a third dielectric fill material over the second dielectric liner.

20. The method of claim 14, further comprising:
planarizing the isolation material, the dielectric liner, and the dielectric fill material;
etching back the dielectric fill material and the dielectric liner to form a first recess over the dielectric fill material and between opposite sidewalls of the dielectric liner;
depositing a second dielectric liner in the first recess; and
depositing a second dielectric fill material over the second dielectric liner, wherein the second dielectric fill material is a seamless material.

* * * * *